US008631304B2

(12) United States Patent
Lasser

(10) Patent No.: US 8,631,304 B2
(45) Date of Patent: Jan. 14, 2014

(54) OVERLAPPING ERROR CORRECTION OPERATIONS

(75) Inventor: Menahem Lasser, Kohav-Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 214 days.

(21) Appl. No.: 13/130,747

(22) PCT Filed: Jan. 28, 2010

(86) PCT No.: PCT/IB2010/000141
§ 371 (c)(1),
(2), (4) Date: May 23, 2011

(87) PCT Pub. No.: WO2011/092532
PCT Pub. Date: Aug. 4, 2011

(65) Prior Publication Data
US 2011/0258514 A1 Oct. 20, 2011

(51) Int. Cl.
H03M 13/00 (2006.01)
(52) U.S. Cl.
USPC .......................................... 714/776
(58) Field of Classification Search
USPC ......... 714/763, 745, 758, 782, 784, 764, 799, 714/805, 807, 701, 776, 702, 718
See application file for complete search history.

(56) References Cited

U.S. PATENT DOCUMENTS

| 2,632,058 | A |   | 3/1953 | Gray |
| 3,958,220 | A |   | 5/1976 | Marshall |
| 4,395,768 | A | * | 7/1983 | Goethals et al. ............... 714/788 |
| 4,633,470 | A |   | 12/1986 | Welch et al. |
| 4,736,376 | A |   | 4/1988 | Stiffler |
| 5,043,940 | A |   | 8/1991 | Harari |
| 5,146,592 | A |   | 9/1992 | Pfeiffer et al. |
| 5,434,825 | A |   | 7/1995 | Harari |
| 5,873,112 | A |   | 2/1999 | Norman |
| 5,930,167 | A |   | 7/1999 | Lee et al. |
| 6,314,026 | B1 |   | 11/2001 | Satoh et al. |
| 6,330,277 | B1 |   | 12/2001 | Gelblum et al. |
| 6,430,722 | B1 |   | 8/2002 | Eroz et al. |
| 6,487,693 | B1 |   | 11/2002 | Kim et al. |

(Continued)

FOREIGN PATENT DOCUMENTS

JP 54-162933 12/1979
WO 2005022814 A1 3/2005

(Continued)

OTHER PUBLICATIONS

Shannon, C.E. "A Mathematical Theory of Communication," The Bell System Technical Journal, 1948, vol. 27, pp. 5-83.

(Continued)

Primary Examiner — Phung M Chung
(74) Attorney, Agent, or Firm — Toler Law Group, PC

(57) ABSTRACT

Systems and methods of overlapping error correction operations are disclosed. A method at an encoder device includes receiving data to be encoded, including a first data group and a second data group. The first data group includes a first subgroup that contains a first plurality of bits and a second subgroup that contains a second plurality of bits. The second data group includes the second subgroup and a third subgroup that includes a third plurality of bits. A first encode operation encodes the first data group to generate a first codeword and a second encode operation encodes the second data group.

31 Claims, 12 Drawing Sheets

(56) References Cited

U.S. PATENT DOCUMENTS

| | | | |
|---|---|---|---|
| 6,516,035 | B1 | 2/2003 | Wang et al. |
| 6,522,580 | B2 | 2/2003 | Chen et al. |
| 6,526,531 | B1 | 2/2003 | Wang |
| 6,633,856 | B2 | 10/2003 | Richardson et al. |
| 6,643,188 | B2 | 11/2003 | Tanaka et al. |
| 6,684,289 | B1 | 1/2004 | Gonzalez et al. |
| 6,707,713 | B1 | 3/2004 | Parker et al. |
| 6,731,696 | B1 | 5/2004 | Gelblum et al. |
| 6,751,766 | B2 | 6/2004 | Guterman et al. |
| 6,842,491 | B2 | 1/2005 | Gelblum et al. |
| 6,865,708 | B2 | 3/2005 | Wang |
| 6,903,887 | B2* | 6/2005 | Asano et al. ............ 360/31 |
| 7,178,086 | B2 | 2/2007 | Hassner et al. |
| 7,280,408 | B2 | 10/2007 | Guterman et al. |
| 7,301,812 | B2 | 11/2007 | Guterman et al. |
| 7,356,752 | B2 | 4/2008 | Hewitt et al. |
| 7,404,015 | B2* | 7/2008 | Zemach et al. .......... 710/22 |
| 7,567,464 | B2 | 7/2009 | Gendrier et al. |
| 7,844,877 | B2 | 11/2010 | Litsyn et al. |
| 8,055,972 | B2 | 11/2011 | Lasser |
| 8,281,217 | B2* | 10/2012 | Kim et al. ............ 714/763 |
| 8,321,757 | B2 | 11/2012 | Meir et al. |
| 2002/0114194 | A1 | 8/2002 | Kunori |
| 2002/0144196 | A1 | 10/2002 | Chen |
| 2002/0147954 | A1 | 10/2002 | Shea |
| 2004/0015771 | A1 | 1/2004 | Lasser et al. |
| 2004/0148560 | A1 | 7/2004 | Hocevar |
| 2005/0003756 | A1 | 1/2005 | Sun et al. |
| 2005/0013165 | A1 | 1/2005 | Ban |
| 2005/0091565 | A1 | 4/2005 | Eroz et al. |
| 2005/0091570 | A1 | 4/2005 | Eroz et al. |
| 2005/0149815 | A1 | 7/2005 | Eroz et al. |
| 2005/0160350 | A1 | 7/2005 | Dror et al. |
| 2005/0193320 | A1 | 9/2005 | Varnica et al. |
| 2005/0204256 | A1 | 9/2005 | Yeh et al. |
| 2005/0229087 | A1 | 10/2005 | Kim et al. |
| 2007/0061502 | A1 | 3/2007 | Lasser et al. |
| 2007/0086239 | A1 | 4/2007 | Litsyn et al. |
| 2007/0089034 | A1 | 4/2007 | Litsyn et al. |
| 2007/0124652 | A1 | 5/2007 | Litsyn et al. |
| 2007/0277066 | A1 | 11/2007 | Gajapathy et al. |
| 2008/0148115 | A1 | 6/2008 | Sokolov et al. |
| 2008/0282128 | A1 | 11/2008 | Lee et al. |
| 2008/0320214 | A1 | 12/2008 | Ma et al. |
| 2009/0043951 | A1 | 2/2009 | Shalvi et al. |
| 2010/0115376 | A1 | 5/2010 | Shalvi et al. |
| 2010/0313099 | A1 | 12/2010 | Yamaga |
| 2011/0041040 | A1 | 2/2011 | Su et al. |
| 2011/0161774 | A1 | 6/2011 | Shin et al. |
| 2011/0216588 | A1 | 9/2011 | Kim et al. |
| 2011/0231740 | A1 | 9/2011 | Lasser et al. |
| 2011/0258515 | A1 | 10/2011 | Earle et al. |
| 2011/0289381 | A1 | 11/2011 | Daga et al. |
| 2012/0221919 | A1 | 8/2012 | Ekas et al. |
| 2012/0254696 | A1* | 10/2012 | Perlmutter et al. ......... 714/763 |

FOREIGN PATENT DOCUMENTS

| | | | |
|---|---|---|---|
| WO | 2007057885 | A2 | 5/2007 |
| WO | 2007132457 | A2 | 11/2007 |
| WO | 2008053472 | A2 | 5/2008 |
| WO | 2008068747 | A2 | 6/2008 |

OTHER PUBLICATIONS

Luby, Michael G. et al. "Improved Low Density Parity-Check Codes Using Irregular Graphs," IEEE Transactions on Information Theory, vol. 47, No. 2, Feb. 2001, pp. 585-598.

Gallagher, R.G. "Low-Density Parity-Check Codes," IRE Transactions on Information Theory, vol. IT-8, pp. 21-28, Jan. 1962.

Richardson, Thomas J. et al. "The Capacity of Low-Density Parity-Check Codes Under Message-Passing Decoding," IEEE Transactions on Information Theory, vol. 47, No. 2, Feb. 2001, pp. 599-618.

Berrou, Claude et al. "Near Shannon Limit Error—Correcting Coding and Decoding: Turbo Codes (1)," IEEE International Conference on Communications, 1993, pp. 1064-1070.

Mansour, Mohammad M. "High-Throughput LDPC Decoders," IEEE Transactions on Very Large Scale Integration Systems, vol. 11, No. 6, Dec. 2003, pp. 976-996.

Richardson, Thomas J. et al. "Design of Capacity-Approaching Irregular Low-Density Parity-Check Codes," IEEE Transactions on Information Theory, vol. 47, No. 2, Feb. 2001, pp. 619-637.

Sharon, Eran et al. "An Efficient Message-Passing Schedule for LDPC Decoding," 23rd IEEE Convention in Tel-Aviv, Israel, Sep. 6-7, 2004, pp. 223-226.

Tanner, Michael R. "A Recursive Approach to Low Complexity Codes," IEEE Transactions on Information Theory, vol. IT-27, No. 5, Sep. 1981, pp. 533-547.

Zhang, Juntan et al. "Shuffled Belief Propagation Decoding," Proceedings of the 36th Asilomar Conference on Signals, Systems and Computers, Pacific Grove, USA, 2002, vol. 1, pp. 8-15.

Peterson, Wesley W. "Error-Correcting Codes," Second Edition, Jan. 1961, M.I.T. Press, Massachusetts Institute of Technology, Cambridge, MA, USA, 4 pages.

Blahut, Richard E. "Theory and Practice of Error Control Codes," Addison-Wesley Publishing Company, 1983, 5 pages.

Chambers, W.G. et al. "Algorithm for Solving the Welch-Berlekamp Key-Equation, With a Simplified Proof," Electronics Letters, vol. 29, No. 18, Sep. 1993, pp. 1620-1621.

Guruswami, Venkatesan et al. "Improved Decoding of Reed-Solomon and Algebraic-Geometry Codes," IEEE Transactions on Information Theory, vol. 45, No. 6, Sep. 1999, pp. 1757-1767.

Mandelbaum, David M. "Decoding of Erasures and Errors for Certain RS Codes by Decreased Redundancy," IEEE Transactions on Information Theory, vol. IT-28, No. 2, Mar. 1982, pp. 330-336.

Massey, J.L. "Shift-Register Synthesis and BCH Decoding," IEEE Transactions on Information Theory, vol. IT-15, No. 1, Jan. 1969, pp. 122-127.

"TM Synchronization and Channel Coding—Summary of Concept and Rationale," Report Concerning Space Data System Standards, Informational Report, Green Book, Jun. 2006, 89 pages.

Nefedov, Nikolai et al. "Performance of Low Complexity Concatenated Codes Formed by Differential Encoders," Proceedings of the International Conference on Telecommunications, XP009037088, vol. 1, Jun. 23, 2002, pp. 151-155.

Barbulescu, A.S. et al. "Rate Compatible Turbo Codes," Electronics Letters, vol. 31, No. 7, Mar. 30, 1995, pp. 535-536.

Pretzel, Oliver "Error-Correcting Codes and Finite Fields," Oxford Applied Mathematics and Computing Science Series, Clarendon Press, Oxford, 1992, 5 pages.

Berlekamp, Elwyn R. "Algebraic Coding Theory," Revised 1984 Edition, Aegean Park Press, 4 pages.

Bogino, Mattia C.O. "Sliding-Window Digital Fountain Codes for Streaming of Multimedia Contents," IEEE Symposium on Circuits and Systems, May 2007, pp. 3467-3470.

International Search Report and Written Opinion issued in International Application No. PCT/IB2010/000141 dated Jun. 25, 2010, 2 pages.

Dipert, Brian. "Banish Bad Memories," www.ednmag.com, Nov. 22, 2001, 7 pages.

"Soft Errors in Electronic Memory—A White Paper," Tezzaron Semiconductor, www.tezzaron.com, Version 1.1, Jan. 5, 2004, pp. 1-7.

Olson, Alan R. et al. "Solid State Drives Data Reliability and Lifetime," White Paper, Imation, Apr. 7, 2008, pp. 1-27.

The International Search Report and Written Opinion of the International Searching Authority mailed Mar. 13, 2009 in International Application No. PCT/IL06/01305, 10 pages.

The International Search Report and Written Opinion of the International Searching Authority mailed Jun. 25, 2010 in International Application No. PCT/IB2010/000141, 11 pages.

* cited by examiner

OVERLAPPING ERROR CORRECTION OPERATIONS

FIELD OF THE DISCLOSURE

The present disclosure is generally related to encoding and decoding data.

BACKGROUND

Non-volatile semiconductor memory devices, such as removable storage cards or Universal Serial Bus (USB) flash memory devices, have enabled increased portability of data and software applications. Data storage densities of non-volatile semiconductor memory devices are generally increasing and support greater performance in portable electronic devices. Some features that enable higher density, such as multi-level cell technologies, may benefit from stronger error detection and correction mechanisms, referred to as error correction coding ("ECC") mechanisms.

For example, each sector of a flash drive, such as a 512-byte sector, may have has its own ECC mechanism that includes a fixed number of parity bits, such as 80 parity bits, for the sector. When multiple sectors are encoded together, instead of independently, the strength of the ECC improves. To illustrate, more errors can be corrected in a two-kilobyte (2 KB) word encoded with 320 parity bits than in four 512-byte words that are each independently encoded with 80 parity bits.

However, when multiple sectors are encoded together, such as in 2 KB words, a read request for a data word that is not aligned with the encoded word—i.e. a word that at least partially spans two encoded words—may require full reading and decoding of multiple encoded words. Thus, the gain in ECC strength by jointly encoding multiple sectors may be at least partially offset by decreased read performance when a requested word is not aligned with the encoded words.

SUMMARY

Overlapping error correction operations are disclosed. Received data may be encoded by performing error correction encoding to overlapping groups of bits of the received data to generate multiple codewords. The received data may be encoded such that a multi-sector codeword is aligned with each sector within the received data. As a result, ECC strength may benefit from multi-sector encoding and read performance may benefit by having a codeword aligned with each sector boundary.

DETAILED DESCRIPTION

Figure 1:
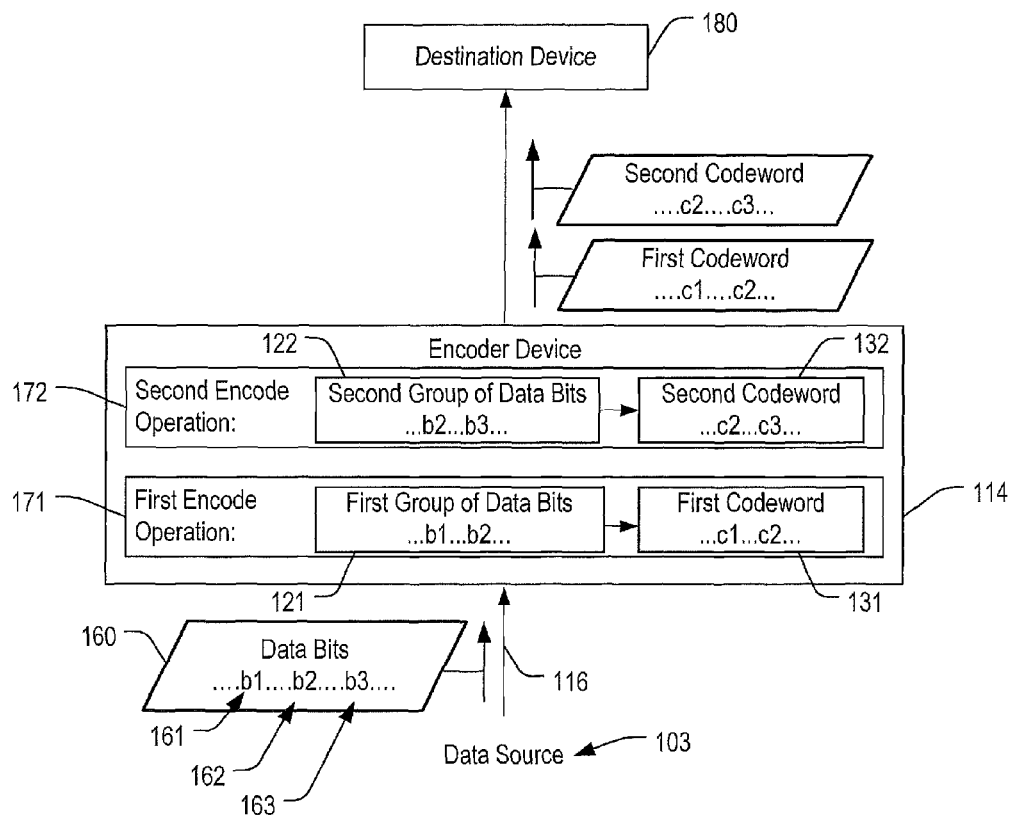
FIG. 1 is a block diagram of a first particular embodiment of a system to perform overlapping error correction operations.

Referring to FIG. 1, a first embodiment of a system is depicted and generally designated 100. The system 100 includes a data source 103 coupled to an encoder device 114. The encoder device 114 is coupled to a destination device 180. The encoder device 114 is configured to encode data bits 160 in an overlapping format to be provided to the destination device 180 as a plurality of codewords. The encoder device 114 may introduce redundant encoded information into multiple codewords that may be used by the destination device 180 to correct for errors during transmission of the codewords.

The data source 103 may be any source of binary or symbol data, such as a memory device, a transmitter device, or another data source. The data source 103 is coupled to the encoder device 114 by a channel or bus 116. The data source 103 transmits the data bits 160 via the bus 116 to the encoder device 114. The data bits 160 include multiple binary values, illustrated as a first bit b1 161, a second bit b2 162, and a third bit b3 163. The bits 161-163 may be consecutive bits of the data bits 160. Alternatively, one or more additional bits may be interspersed between two or more of the bits 161-163. In addition, the data bits 160 may include additional bits prior to the first bit 161, following the last bit 163, or any combination thereof.

The encoder device 114 is configured to receive the data bits 160 including the first bit b1 161, the second bit b2 162, and the third bit b3 163. The encoder device 114 is configured to initiate a first encode operation 171 to encode a first group 121 of the data bits 160. The first group 121 includes the first bit 161 and the second bit 162, but does not include the third bit 163. The first encode operation 171 results in generation of the first codeword 131. The first codeword 131 is illustrated as including a first codeword symbol c1 and a second codeword symbol c2. In a particular embodiment, where the first encode operation 171 is a systematic encoding operation, the first codeword symbol c1 may be a bit duplicating a value of the first bit b1 161, and the second codeword symbol c2 may be a bit duplicating a value of the second bit b2 162. In an alternative embodiment, where the first encode operation 171 is a non-systematic encode operation, the codeword symbols c1 and c2 may not duplicate values of the first and second bits b1 161 and b2 162. As illustrative, non-limiting examples, the encoder 114 may be a Reed-Solomon (RS) encoder, a Bose-Chaudhuri-Hocquenghem (BCH) encoder, or another type of systematic or non-systematic error correction encoder.

The encoder device 114 is also configured to initiate a second encode operation 172 to encode a second group 122 of the data bits 160 to generate a second codeword 132. The second group 122 includes the second bit b2 162 and the third bit b3 163, but does not include the first bit b1 161. The second codeword 132 is illustrated as including the second codeword symbol c2 and a third codeword symbol c3.

The encoder device 114 is configured to provide the first codeword 131 and the second codeword 132 to the destination device 180. To illustrate, the destination device 180 may be a memory device to store the encoded data bits, a transmitter to provide the encoded data bits via a communication channel to a receiving device (not shown), or any other device to receive encoded data. The destination device 180 may transmit, store, decode, or otherwise process the codewords received from the encoder device 114.

Because the encoder device 114 performs the first encode operation 171 on the first group 121 of the data bits 160 and the second encode operation 172 on the second group 122 of the data bits 160, access to bits within the first group 121 and the second group 122 may be simplified as compared to an encoding scheme that does not use overlapping codewords. To demonstrate, in an encoding scheme that encodes b1 and b2 as a first codeword and encodes b3 and subsequent bits (but not b2) as a second codeword, access to the bits b2 and b3 would require accessing and decoding the first codeword to retrieve b2 and also accessing and decoding the second codeword to retrieve b3. By using overlapping codewords, the system 100 enables access to the bits b2 and b3 by decoding a single codeword (i.e. the second codeword 132).

The terms "first" and "second" are used in the present disclosure as identifiers to distinguish between multiple similar elements. Use of the terms "first," "second," and "third" do not indicate or imply any order of occurrence or importance among the referenced elements, unless specifically indicated otherwise. For example, the second codeword 132 may be generated and transmitted to a memory, such as the memory 204 of FIG. 2, before the first codeword 131 is transmitted to the memory. As another example, the first encode operation 171 may occur before the second encode operation 172, after the second encode operation 172, concurrently with the second encode operation 172, or any combination thereof.

Figure 2:
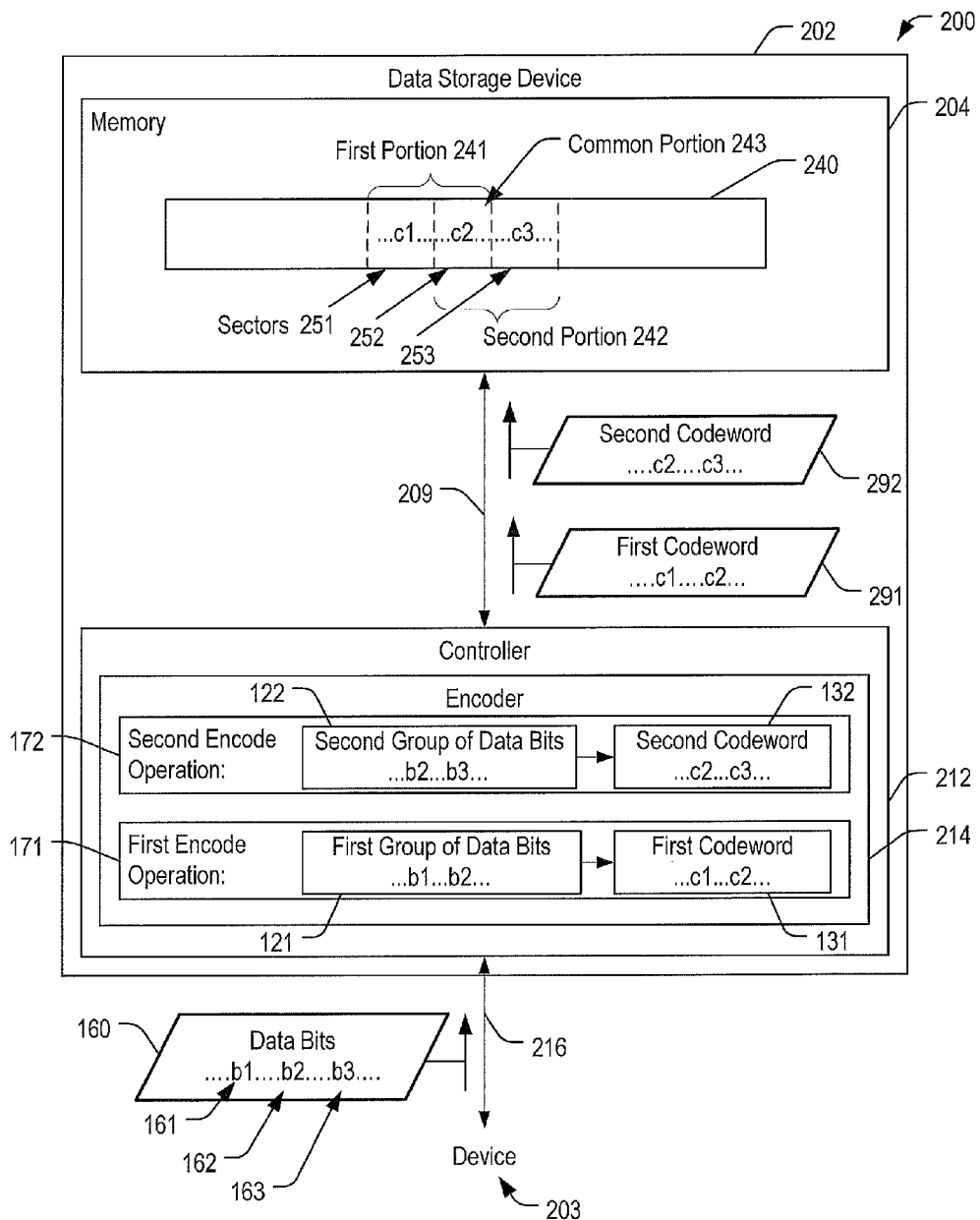
FIG. 2 is a block diagram of a second particular embodiment of a system to perform overlapping error correction operations.

FIG. 2 depicts a particular embodiment of a system 200 that implements overlapping codewords as described in FIG. 1 at a data storage device 202 to improve read performance while using long codewords. The system 200 includes the data storage device 202 coupled to a device 203 external to the data storage device 202 via a communication channel or bus 216. The data storage device 202 includes a controller 212 coupled to a memory 204. The controller 212 includes an encoder 214 that is configured to initiate the first encode operation 171 and the second encode operation 172 in response to receiving the data bits 160, in a similar manner as the system 100 of FIG. 1. The controller 212 is configured to provide first transmission data 291 corresponding to the first codeword 131 and second transmission data 292 corresponding to the second codeword 132 to be stored at the memory 204.

As illustrated, the external device 203 provides the data bits 160 to the data storage device 202 via the bus 216. The data bits 160 include the first data bit b1 161, the second data bit b2 162, and the third data bit b3 163. The data bits 160 are received at the controller 212 and provided to the encoder 214.

The encoder 214 is configured to perform the first encode operation 171 to encode the first group 121 of data bits and to generate the resulting first codeword 131. The encoder 214 is also configured to receive the second group 122 of data bits and perform the second encode operation 172 to generate the second codeword 132. The controller 212 is configured to provide the first and second codewords 131, 132 to the memory 204, for example, via the first transmission data 291 and the second transmission data 292.

The memory 204 includes a first portion 241 and a second portion 242 of a memory area 240. For example, the memory area 240 may include a word line, a page, another region of a memory, or any combination thereof. The memory area 240 may include at least a portion of a word line of a flash memory array. Alternatively, or in addition, the memory area 240 may include a portion of another type of non-volatile memory, a volatile memory, or any combination thereof.

The memory area 240 also includes a common portion 243. The common portion 243 is included in both the first portion 241 and the second portion 242. The common portion 243 stores encoded data corresponding to information in both the first codeword 131 and the second codeword 132.

The memory area 240 may include multiple sectors, such as a representative first sector 251, a second sector 252, and a third sector 253. The first portion 241 spans the first sector 251 and the second sector 252. The second portion 242 spans the second sector 252 and the third sector 253. The common portion 243 corresponds to the second sector 252.

As illustrated, a redundant portion of the first codeword 131 and the second codeword 132, illustrated as the second codeword symbol c2, may be stored in the common portion 243. A non-redundant portion c1 of the first codeword 131 is stored in the first portion 241 outside of the common portion 243. A non-redundant portion c3 of the second codeword 132 is stored in the second portion 242 outside of the common portion 243. As illustrated, each of the codewords 131-132 is a multi-sector word, with the first codeword 131 stored in the first and second sectors 251-252 and the second codeword 132 stored in the second and third sectors 252-253.

During operation, the data bits 160 are received at the data storage device 202 from the external device 203. The controller 212 may receive the data bits 160 and may initiate the first encode operation 171 to generate the first codeword 131 and may initiate the second encode operation 172 to generate the second codeword 132. The controller 212 sends the first codeword 131 to the memory 204 via the first transmission data 291 representing the first codeword 131 to be stored in the first portion 241 of the memory 204. The controller 212 sends the second codeword 132 to be stored at the second portion 242 of the memory 204 via the second transmission data 292 representing the second codeword 132. The first transmission data 291 and the second transmission data 292 are transmitted via a communication channel or bus 209. The memory 204 receives the transmission data 291-292 and stores the first codeword 131 in the first portion 241 and the second codeword 132 in the second portion 242. By storing a redundant portion (e.g. c2) of the first and second codeword 131-132 at the common portion 243, an amount of memory used to store the codewords 131-132 may be reduced.

By encoding the data bits 160 into the first codeword 131 and the second codeword 132, data may be read from the memory 204 via a read operation that starts at the second sector 252 without incurring a performance penalty from decoding multiple codewords. To illustrate, when data is stored in multi-sector codewords that do not overlap, a read request to read data beginning within a first codeword and continuing into a second codeword would require two read operations: a first read operation to read and decode the first codeword and a second read operation to read and decode the second codeword. Both codewords would have to be read and decoded because the requested data spans a codeword boundary.

In contrast, by encoding the data bits 160 into overlapping codewords 131-132, the data may be stored so that a codeword begins at each sector 251-253. As a result, a read request for data beginning at any of the sectors 251-253 may be serviced by performing a single read and decode operation. For example, a request for data stored at sectors 251 and 252 can be serviced by reading and decoding the first codeword 131 from the first portion 241, while a request for data stored at sectors 252 and 253 can be serviced by reading and decoding the second codeword 132 from the second portion 242. Therefore, the system 200 enables improved ECC capability arising from long codewords with reduced read performance penalties due to read operations that span codeword boundaries.

In a memory storage application such as depicted in FIG. 2, each of multiple overlapping codewords may be aligned to regular intervals of the memory area 240. For examples, each codeword may be stored at eight consecutive half-kilobyte (KB) (e.g. 512 bytes) sectors, such that the first codeword is a four-KB data word. Alternatively, each codeword may be stored at sectors having a size other than 512 bytes (e.g. 256 bytes, 1024 bytes (1 KB), 2048 bytes (2 KB), or any other "power of two" or other-sized sector).

For example, with eight-sector codewords and data "chunks" or word sizes of 4 KB, where "N" is a number evenly divisible by eight with a zero remainder, and considering sector number N within the group of sectors containing sector N, when storing the sectors into the memory, sectors $\{N, N+1, N+2, \ldots, N+7\}$ are encoded as one codeword. The resulting parity may be stored with sector N+7. Sectors $\{N+1, N+2, N+3, \ldots, N+8\}$ may be encoded as one codeword, with the resulting parity stored with sector N+8. Sectors $\{N+2, N+3, N+4, \ldots, N+9\}$ may be encoded as one codeword, with the resulting parity stored with sector N+9. This process may continue until reaching the end of the group of sectors. The process may correspond to a "sliding window" sliding along the sequence of sectors with a step of one sector per move. Each move generates a codeword from the eight sectors currently "under the window".

An advantage of the examples of memory storage systems depicted in FIGS. 2-10 may arise with read performance because, whatever the starting address of a read request, the sectors included in the request (e.g. eight sectors) have one encoded codeword containing all of the requested sectors together. It may therefore be unnecessary to read and decode two codewords for servicing a single read request. Although encoding each sector as a starting sector of a multi-sector codeword may cause a small increase in complexity of a write process, in some implementations a significant increase in read performance may be obtained.

A "group of sectors" within which encoding can take place can include:

A) A page of flash media. For example, a page may be an 8 KB data read unit of sixteen sequentially ordered sectors of 512 bytes each. In this example, starting sectors of codewords are all of the sectors of a page from the first sequential sector (i.e. at a beginning of the page) up to and including the ninth sequential sector. The tenth through sixteenth sectors do not start a codeword in this particular example of a page-based scheme. If a read request starts with one of the tenth through sixteenth sectors, then two codewords—the codeword including the first requested sector and the codeword including the last requested sector—may be read and decoded.

B) A block of flash media. For example, a block may be a 1 MB erase unit of 2048 sequentially ordered sectors of 512 bytes each. All of the sectors of a block except the last seven sectors (i.e. sectors 2042-2048) may be starting sectors of codewords. If a read request starts in one of the last seven sectors, two codewords may be read and decoded in response to the read request. If a read request starts in any of the first 2041 sectors, a single codeword may be read and decoded in response to the read request.

C) A whole address space of flash media. In this example only the last seven sectors of the address space may not be starting sectors of codewords. However, when the flash memory includes sectors of 512 bytes, any read request of 4 KB or larger starting in the last seven sectors of the address space attempts to read non-existing sectors (i.e. sectors outside the address space). Therefore, a single codeword of eight sectors may be read and decoded for any read request that accesses valid sectors.

As the grouping of sectors lengthens, a relative proportion of codewords that can be decoded with a single read and decode operation increases, with device grouping exceeding block grouping and block grouping exceeding page grouping. Writing complexity, however, may increase with increased group length, so that page grouping may have less complexity than block grouping and block grouping may have less complexity than device grouping. For example, device grouping may include encoding together sectors from different blocks, complicating flash management algorithms for writing. Similarly, block grouping may include encoding together sectors from different pages. The complexities may arise when a write operation updates some but not all sectors of a group and as a result many codewords may have to be updated. Even the update of a single sector may involve re-computing eight codewords in some of the above non-limiting examples.

Additional efficiencies may result from cached storage systems where incoming data may be first buffered in an input cache and later copied to a final destination(s). For example, when a page of data is copied from the cache and written into its final location, the pages that follow the written page in the block that contains the written page may already reside in the cache and may therefore already be known to the flash management system. Therefore, when writing a page of a block as part of the cache flushing process, the data that is to be written in the next page may be available to the system, and the methods of the present disclosure can be utilized even when crossing page boundaries (assuming block grouping of sectors).

In embodiments where parity bits are stored adjacent to the sectors they protect, the parity of each codeword may be smaller in size than the parity of one or more multi-sector error correction code schemes that does not use overlapping codewords. For example, in a particular implementation, only the parity bits of the last sector of a codeword are available for that codeword, as the parity bits stored in the sectors of the codeword other than the last sector, are used for previous codewords. If a sector suffers from a sufficient number of errors, when a host requests a 4 KB data chunk starting with that sector, the decoding of the codeword in which the erroneous sector is the first sector fails. Because the other sectors in the failing codeword take part in other codewords in which the high-error sector does not take part, those other codewords may be successfully decoded. In response to the other codewords being decoded, the other sectors are known, and known data of the known sectors can be fed into the decoder in a second attempt to decode the original codeword. Decoding may be substantially more likely to succeed, because only the bits of the original sector are not known. Thus, a potential loss of error correction capability due to the use of less parity bits is at least partially offset by multiple protecting codewords corresponding to each sector. Examples of decoder operation are described with respect to FIGS. 8-10, 13, and 15.

Even if none of the codewords in which a requested sector takes part is successfully decoded on its own, decoding the requested sector may be possible by combining decode information of all or some of the codewords containing the requested sector. This can be done by passing information between decoders of the different codewords. A strong connection between decoders or decode operations that at least partially compensates for a potentially weaker error protection of each codeword may result from sharing of user data bits between decode operations.

In some embodiments, at least some of the parity bits of a codeword may be stored in locations that are not adjacent to the sectors the parity bits protect. For example, the parity of sectors one through eight of an eight-sector codeword may be stored adjacent to sectors one to eight, and a size of the parity may be the same as in other systems that do not use overlapping codewords so that the error correction capability is not less than in the other systems. The parity bits of the codewords corresponding to sectors 2-9, 3-10, 4-11, etc. may be stored, at least partially, in locations that are non-adjacent to the corresponding sectors. For example, the parity bits can be stored in dedicated parity blocks that are reserved for storing parity information. The parity size of each codeword may be equal to the parity size of each codeword in another multi-sector system that does not use overlapping codewords, and therefore a correction capability of a single codeword may be equal to the other system. In addition, error correction capability may be improved over other systems, such as by using one or more information passing techniques between decode operations as described above.

It should be understood that the above numerical examples are just examples and should not be construed as limiting the scope of the present disclosure. Specifically, the sector size may be different from 0.5 KB, the data chunk size may be different from 4 KB, the page size may be different from 8 KB, the block size may be different from 1 MB, etc. Various techniques of the present disclosure are equally applicable to all feasible values of parameters. In addition, although several of the above examples are described in a memory implementation, such as a flash memory, the present disclosure is also applicable to other types of systems, such as an illustrative communication system depicted in FIG. 11.

Figure 3:
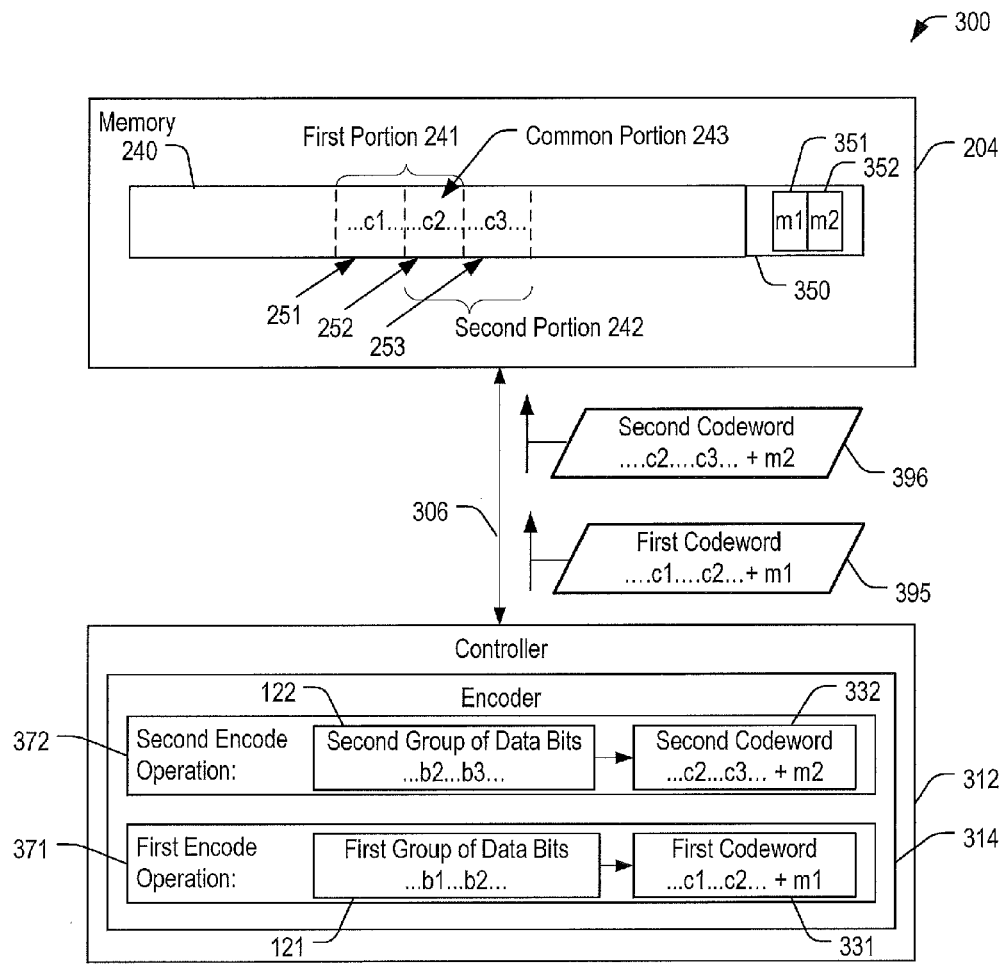
FIG. 3 is a block diagram of a third particular embodiment of a system to perform overlapping error correction operations.

FIG. 3 depicts an embodiment of a system 300 including the memory 204 coupled to a controller 312 and storing metadata information related to overlapping codewords. The controller 312 includes an encoder 314 configured to perform a first encode operation 371 and a second encode operation 372 to generate the metadata information that is stored at the memory 204.

The memory 204 includes the memory area 240, the first portion 241, the second portion 242, and the common portion 243. The first portion 241 spans the sectors 251-252 and the second portion spans the sectors 252-253. The memory area 240 also includes a metadata portion 350 that includes a first metadata portion 351 and a second metadata portion 352. The first metadata portion 351 stores first error correction bits m1, such as parity bits, that correspond to data stored in the first portion 241. The second metadata portion 352 stores second error correction bits m2 corresponding to data stored in the second portion 242.

The controller 312 is configured to initiate the first encode operation 371 to encode the first group of data bits 121 to generate a first codeword 331 that includes the first error correction bits 121. The encoder 314 is also configured to initiate the second encode operation 372 to encode the second group of data bits 122 to generate a second codeword 332 that includes the second error correction bits 122. The controller 312 is configured to send the first codeword 331 to be stored at the memory area 240 via first transmitted data 395. The controller 312 is also configured to send the second codeword 332 to be stored at the memory area 240 via second transmitted data 396.

The metadata portion 350 is shown as a contiguous section of the memory area 240 adjacent to a data area including the portions 241-243 for purpose of illustration and not of limitation. For example, the metadata portion 350 may include one or more regions interspersed throughout the memory area 240. To illustrate, the first metadata portion 351 may be adjacent to the first portion 241 and the second metadata portion 352 may be adjacent to the second portion 242. As another example, one or more of the first metadata portion 351 and the second metadata portion 352 may be located at a same wordline as the first portion 241 or the second portion 242, while another of the first metadata portion 351 and the second metadata portion 352 may be located at a different wordline. As another example, one or more of the metadata portions 351-352 may be located in a separate region of the memory 204 than the portions 241-243, such as at a dedicated parity area for a page, a block, a bank, an array, or another part of the memory 204.

Figure 4:
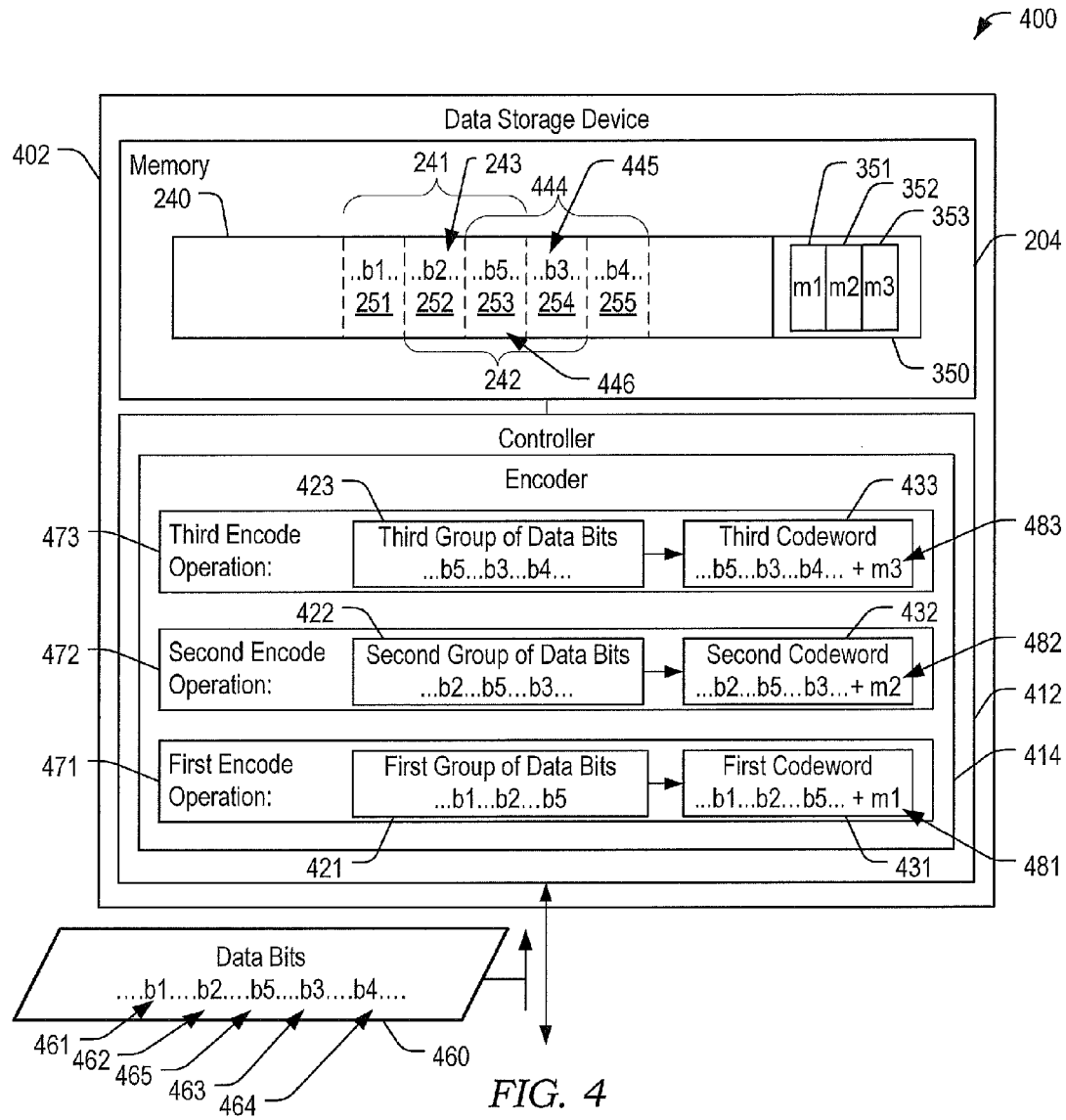
FIG. 4 is a block diagram of a fourth particular embodiment of a system to perform overlapping error correction operations.

Referring to FIG. 4, a system 400 is depicted including a data storage device 402 configured to receive data bits 460 and to store encoded data representing the received data bits 460 at the memory 204 as overlapping codewords that are each retrievable via a data read beginning at a sector boundary. The system 400 enables the effective interleaving of multiple overlapping systematic codewords such that redundant portions of multiple codewords are stored in common areas to enable read access beginning at codeword boundaries and to reduce an amount of data storage used, while the error correction bits corresponding to each codeword may be stored in non-overlapping portions of the memory 204.

The data storage device 402 is configured to receive the data bits 460 including a first bit b1 461, a second bit b2 462, a fifth bit b5 465, a third bit b3 463, and a fourth bit b4 464. The controller 412 is configured to initiate a first encode operation 471 at an encoder 414. The first encode operation 471 encodes a first group 421 of the data bits 460 to generate a first codeword 431. The first group 421 includes the first data bit b1 461, the second data bit b2 462, and the fifth data bit b5 465, but does not include the third data bit b3 463 and the fourth data bit b4 464. The first encode operation 471 generates the first codeword 431, illustrated as a systematic encoding that includes the first data bit b1 461, the second data bit b2 462, the fifth data bit b5 465, and first error correction bits m1 481.

The controller 412 is configured to initiate a second encode operation 472 at the encoder 414. The second encode operation 472 encodes a second group 422 of the data bits 460 to generate a second codeword 432. The second group 422 of the data bits 460 includes the second data bit b2 462, the fifth data bit b5 465, and the third data bit b3 463. The second codeword 432 includes the second data bit b2 462, the fifth data bit b5 465, and the third data bit b3 463 and also includes second error correction bits m2 482.

The controller 412 is configured to initiate a third encode operation 473 at the encoder 414 that encodes a third group 423 of the data bits 460 to generate a third codeword 433. The third group 423 includes the fifth data bit b5 465, the third data bit b3 463, and the fourth data bit b4 464, but does not include the first data bit b1 461 and the second data bit b2 462. The third codeword 433 includes the fifth data bit 465, the third data bit 463, the fourth data bit 464, and third error correction bits m3 483.

The memory 204 includes the data area 240 having the first portion 241 and the second portion 242 overlapping the first portion 241 at the common portion 243. The memory area 240 also includes a third portion 444 overlapping the first and second portions 241 and 242 at a third common portion 446 and overlapping the second portion 242 at a second common portion 445. In addition, the memory area 240 includes the metadata area 350 having the first metadata portion 351, the second metadata portion 352, and a third metadata portion 353.

As illustrated, the memory area 240 includes sectors 251-255. The first portion 241 spans sectors 251-253, the second portion 242 spans sectors 252-254, and the third portion 444 spans sectors 253-255. The common portions 243, 445, and 446 correspond to the sectors 252, 254, and 253, respectively.

The controller 412 is configured to send the first codeword 431, the second codeword 432, and the third codeword 433 to be stored at the memory 204. As illustrated, the data bits of the first codeword 431 are stored in the first portion 241. The data bits of the second codeword 432 are stored in the second portion 242 in a manner such that the second bit b2, which is common to the first group 421 and the second group 422, is stored in the common portion 243. The fifth bit b5, which is common to the first group 421, the second group 422, and the third group 423, is stored in the third common portion 446 that is common to each of the first portion 241, the second portion 242, and the third portion 444. The data bits of the third codeword 433 are stored in the third portion 444 with the fifth bit b5 465 and the third bit b3 463 stored in the third and second common areas 446 and 445, respectively. The fourth bit b4 464 is stored in a location of the third portion 444 that is not common to the second portion 242 or the first portion 241. In addition, the first error correction bits m1 481 are stored in the first metadata portion 351, the second error correction bits m2 482 are stored in the second metadata portion 352, and the third error correction bits m3 483 are stored in the third metadata portion 353.

Each codeword 431-433 stored at the memory 204 spans three sectors of the memory area 240 and overlaps other codewords. A codeword begins at each sector 251-255 (although not illustrated at 254-255) so that a request for a three-sector data word beginning at any of the sectors 251-255 will result in a single read and decode operation. Because the data portions of codewords are stored in an interleaved or overlapping manner, efficient storage density is achieved while maintaining enhanced ECC performance arising from long codewords without a read penalty for data access that spans a codeword boundary.

Figure 5:
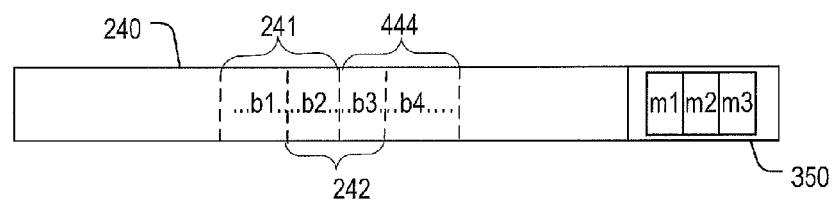
FIG. 5 is a diagram of a first particular embodiment of a memory area to store overlapping codewords.

FIG. 5 depicts an alternative embodiment of the memory area 240 including the first portion 241, the second portion 242, and the third portion 444, as well as the metadata portion 350. As depicted in FIG. 5, the first portion 241 and the second portion 242 include an overlapping portion, and the second portion 242 and the third portion 444 also include an overlapping portion. However, in contrast to FIG. 4, the first portion 241 and the third portion 444 do not overlap (i.e., there is no third overlapping portion 446).

Figure 6:
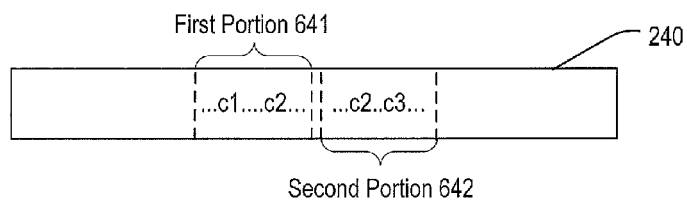
FIG. 6 is a diagram of a second particular embodiment of a memory area to store overlapping codewords.

FIG. 6 depicts another embodiment of the memory area 240 having a first portion 641 and a second portion 642 that do not overlap. As illustrated in FIG. 6, the first portion 641 stores a first codeword represented as the first codeword symbol c1 and the second codeword symbol c2. The second portion 642 stores a second codeword represented as the second codeword symbol c2 and the third codeword symbol c3. As a result, the second codeword symbol c2 is stored redundantly in the memory area 240, which may result in a lower memory data density than in the systems illustrated in FIGS. 2-5.

A data access request for a data word beginning with the first codeword symbol c1 may be mapped to a read operation to read the first portion 641 beginning at a boundary of the first codeword. A data access request for a data word beginning with the second codeword symbol c2 may be mapped to a read operation to read the second portion 642 beginning at boundary of the second codeword. Although the first portion 641 and the second portion 642 are illustrated as non-adjacent, in other embodiments the portions 641-642 may be adjacently located in the memory area 240.

Figure 7:
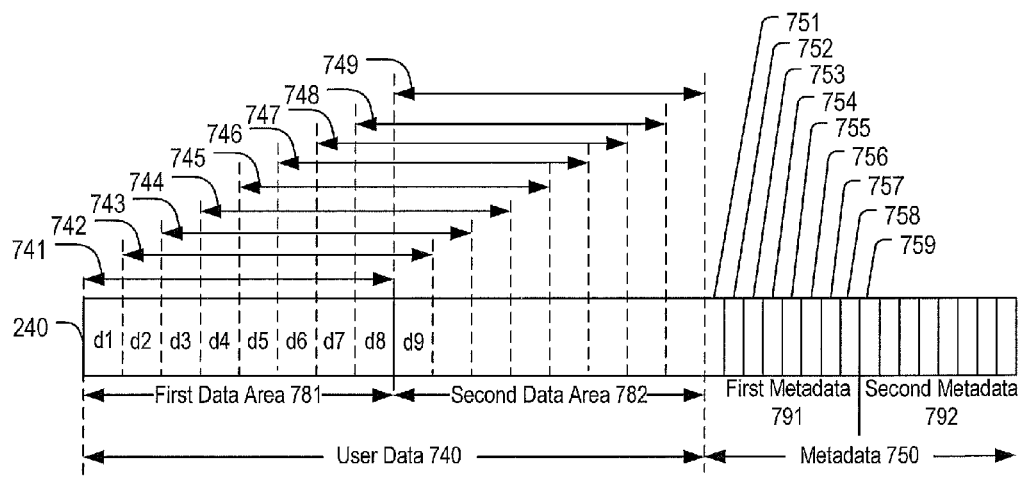
FIG. 7 is a diagram of a third particular embodiment of a memory area to store overlapping codewords.

Referring to FIG. 7, the memory area 240 is depicted as having a user data portion 740 and a metadata portion 750. The user data portion 740 includes a first data area 781 and a second data area 782 that is adjacent to and continuous with the first data area 781. The metadata portion 750 includes a first metadata portion 791 that is sized to store metadata, such as error correction bits corresponding to data stored in the first data area 781. The metadata portion 750 also includes a second metadata portion 792 that is sized to store metadata, such as error correction bits, corresponding to data stored in the second data area 782. As illustrated, data is stored in the memory area 240 as sequential overlapping codewords.

A first codeword 741 of a sequence of stored overlapping codewords is stored in the first data area 781 and includes data values d1, d2, d3, d4, d5, d6, d7, and d8. Each of the data values d1-d8 may include multiple bits. For example, each of the data values d1-d8 may be a 512-byte word.

A second codeword 742 does not include the data value d1 but includes the seven data values d2-d8 plus data value d9. The data value d9 is stored in a first portion of the second user data area 782 and does not overlap with the first codeword 741. A third codeword 743 overlaps with the first codeword 741 beginning with the third data value d3. The sequence of stored overlapping codewords includes a fourth codeword 744, a fifth codeword 745, a sixth codeword 746, a seventh codeword 747, and an eighth codeword 748, each of which has less overlap with the first codeword 741 than the prior codeword in the sequence.

A representative ninth codeword 749 is stored in the second data area 782. The ninth codeword 749 is adjacent to the first codeword 741 and does not overlap the first codeword 741. The ninth codeword 749 overlaps the second codeword 742 with the value d9. The second data area 782 may store multiple data values that are included in multiple overlapping codewords similar to the first data area 781. The user data area 740 may therefore be substantially filled with a sequence of multiple overlapping codewords.

The first metadata portion 791 is divided into multiple metadata portions 751-758. A first metadata portion 751 is configured to store error correction data corresponding to the first codeword 741. A second metadata portion 752 is configured to store error correction data corresponding to the second codeword 742. A third metadata portion 753, a fourth metadata portion 754, a fifth metadata portion 755, a sixth metadata portion 756, a seventh metadata portion 757, and an eighth metadata portion 758 each stores metadata for the corresponding codeword 743-748, respectively. A next metadata portion 759 corresponds to the ninth codeword 749 in the second user data area 782.

Each of the codewords 741-749 may be aligned to regular intervals of the memory area 240, such as each codeword stored at eight consecutive half-kilobyte (KB) (e.g. 512 bytes) sectors, such that the first codeword 741 is a four-KB data word. Alternatively, each codeword 741-749 may be stored at sectors having a size other than 512 bytes (e.g. 256 bytes, 1024 bytes (1 KB), 2048 bytes (2 KB), or any other "power of two" or other-sized sector). The first metadata portion 791 and the second metadata portion 792 may be sized to correspond to a parity bit area for a word of another flash memory that does not use overlapping codewords, such as a 128-bit redundant area for a 4 KB data word as an illustrative, non-limiting example.

Figure 8:
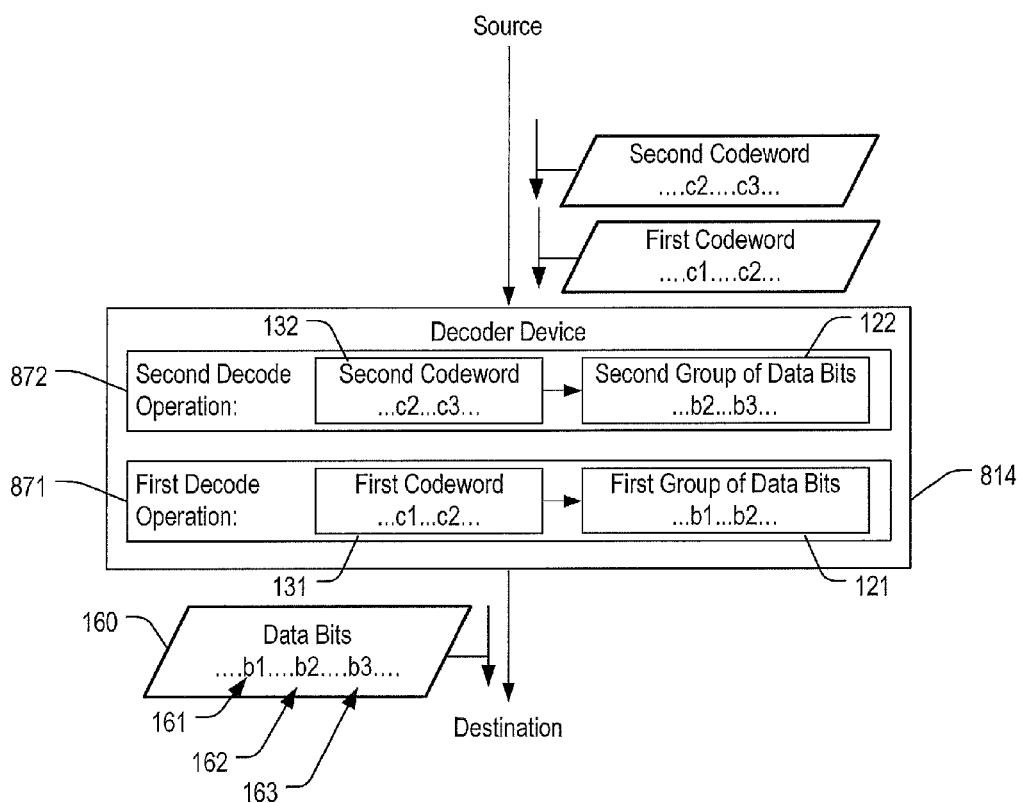
FIG. 8 is a block diagram of an fifth particular embodiment of a system to perform overlapping error correction operations.

FIG. 8 depicts an embodiment of a system 800 including a decoder device 814 that may be configured to decode codewords received from the encoder device 114 of FIG. 1 or from the memory area 240 as depicted in FIGS. 2-7. A first codeword 131 and a second codeword 132 are received at the decoder device 814 from a source. The decoder device 814 is configured to perform multiple decode operations to generate decoded data bits 160 that are provided to a destination. For example, the destination may be a host device or any other device that uses decoded data.

The decoder device 814 is configured to receive multiple codewords from the source, such as the first codeword 131 and the second codeword 132. The decoder device 814 is configured to receive first transmitted data that corresponds to the first codeword 131 that encodes the first group 121 of the data bits 160. The decoder device 814 is also configured to receive second transmitted data that corresponds to the second codeword 132 that encodes the second group 122 of the data bits 160. The decoder device 814 is configured to initiate a first decode operation 871 to decode the first data corresponding to the first codeword 131 to generate the first group 121 of data bits. The decoder device 814 is configured to initiate a second decode operation 872 to decode the second data corresponding to the second codeword 132 to generate the second group 122 of data bits. The decoder device 814 is illustrated as providing the data bits 160 in a manner that removes the redundancy of the second data bit b2 162 from the first group 121 of data bits and the second group 122 of data bits to generate the data bits 160 that include a single instance of the second data bit b2 162.

Figure 9:
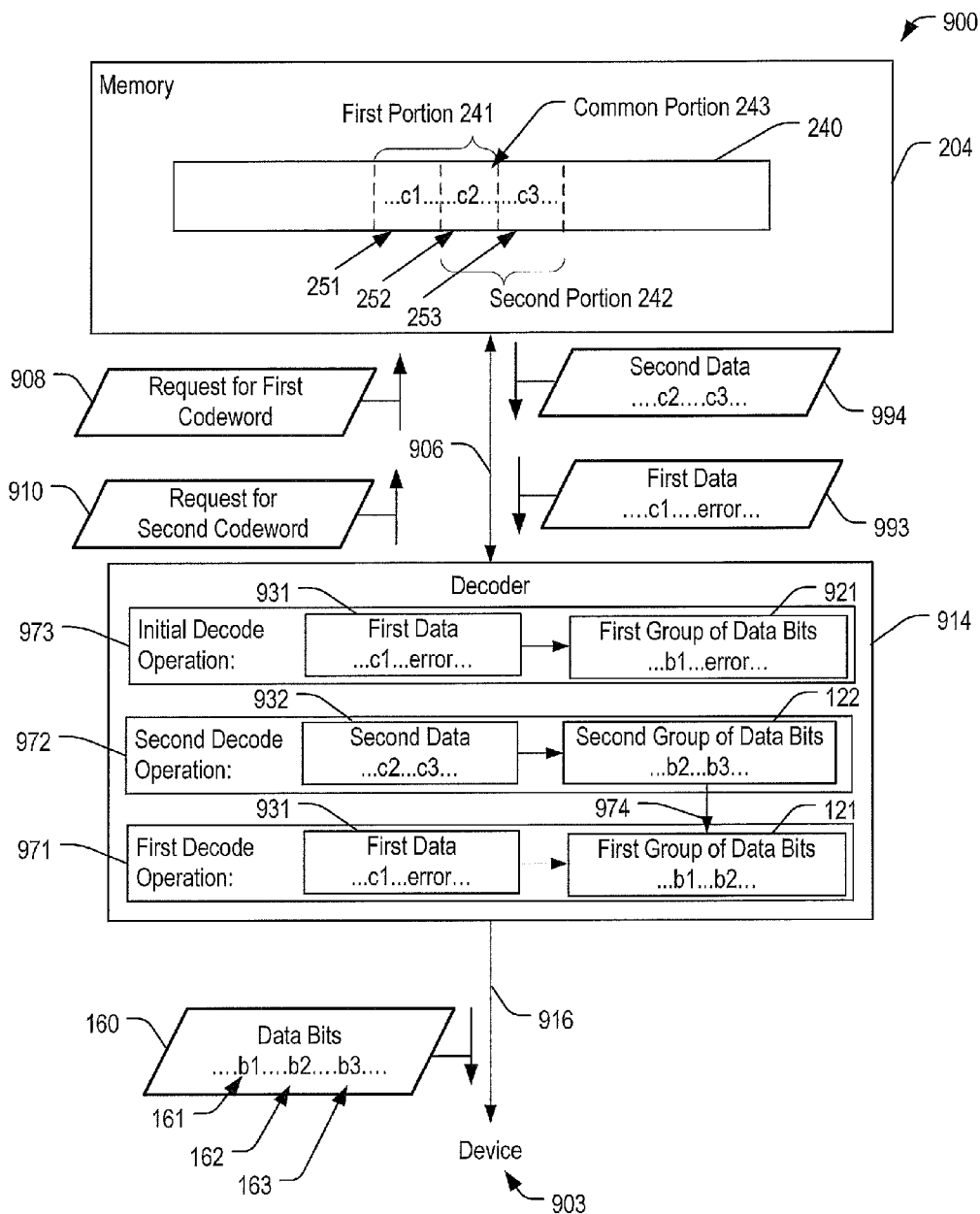
FIG. 9 is a block diagram of a sixth particular embodiment of a system to perform overlapping error correction operations.

FIG. 9 depicts an embodiment of a system 900 including the memory 204 coupled to a decoder 914. The system 900 may correspond to the system 200 of FIG. 2 in a data retrieval mode.

The memory 204 includes the memory area 240 that includes the first portion 241, the second portion 242, and the common portion 243 aligned with the sectors 251-253. The first portion 241 stores the first and second codeword symbols c1 and c2 corresponding to the first codeword 131 (not shown). The second portion 242 stores the second and third codeword symbols c2 and c3 corresponding to the second codeword 132 (not shown). The second codeword symbol c2 is stored in the common portion 243 that is part of both the first portion 241 and the second portion 242.

The decoder 914 is configured to send a request 908 for the first codeword and is configured to send a request 910 for the second codeword to the memory 204. The decoder 914 is also configured to receive first received transmission data 993 corresponding to the first codeword 131 and second received transmission data 994 corresponding to the second codeword 132.

As illustrated, the first received transmission data 993 includes the first codeword symbol c1 but does not include the second codeword symbol c2, which has been replaced by invalid data as a result of one or more errors that may have occurred during memory storage, retrieval, or transmission. The second received transmission data 994 includes the second codeword symbol c2 and the third codeword symbol c3. In addition, the second received transmission data 994 may include errors (not shown) that cause the second transmission data 994 to differ from the second codeword 132 but that are correctable via an error correction algorithm used with the second received transmission data 994.

The decoder 914 is configured to initiate an initial decode operation 973 in response to receiving the first received transmission data 993 including the first data 931. The initial decode operation 973 may result in generation of a first group of data bits 921, where the erroneous data corresponding to the second codeword symbol results in a non-recoverable data error of the first group of data bits 921. Although the initial decode operation 973 is illustrated as generating an erroneous first group of data bits 921, in an alternate embodiment the initial decode operation 973 may instead generate an error, such as a non-convergence error, without generating data bits.

In response to determining an unrecoverable error corresponding to the first data 931, the decoder 914 is configured to initiate a second decode operation 972 to decode the second data 932 (corresponding to the second codeword 132) to generate the second group 122 of data bits. The decoder 914 is also configured to initiate a first decode operation 971 to decode the first data 931 using one or more results from the second decode operation 972. For example, the first decode operation 971 may be initiated after the second decode operation 972 has completed successfully. The decoder 914 is configured to use the value 974 of the second data bit b2 during the first decode operation 971 to decode the first data 931. By providing the value of the second data bit b2 from decoding the second data 994, the first decode operation 971 may be capable of decoding the first group of data bits 121 in spite of the error in the first data 993. The decoder 914 may provide the recovered data bits 160 to the external device 903 via a communication channel or bus 916.

Although the unrecoverable error is illustrated as corresponding to the second data bit b2 162, in other embodiments the unrecoverable error may alternatively or additionally correspond to other data bits encoded by the first codeword 131, such as the first bit b1 161. By using knowledge of a portion of the first group 121 of data bits during the first decode operation 971, such as by using the previously recovered value 974 of the second bit b2 162, the first decode operation 971 may be able to recover from errors in the unknown portion of the first group 121 that would otherwise be unrecoverable.

Figure 10:
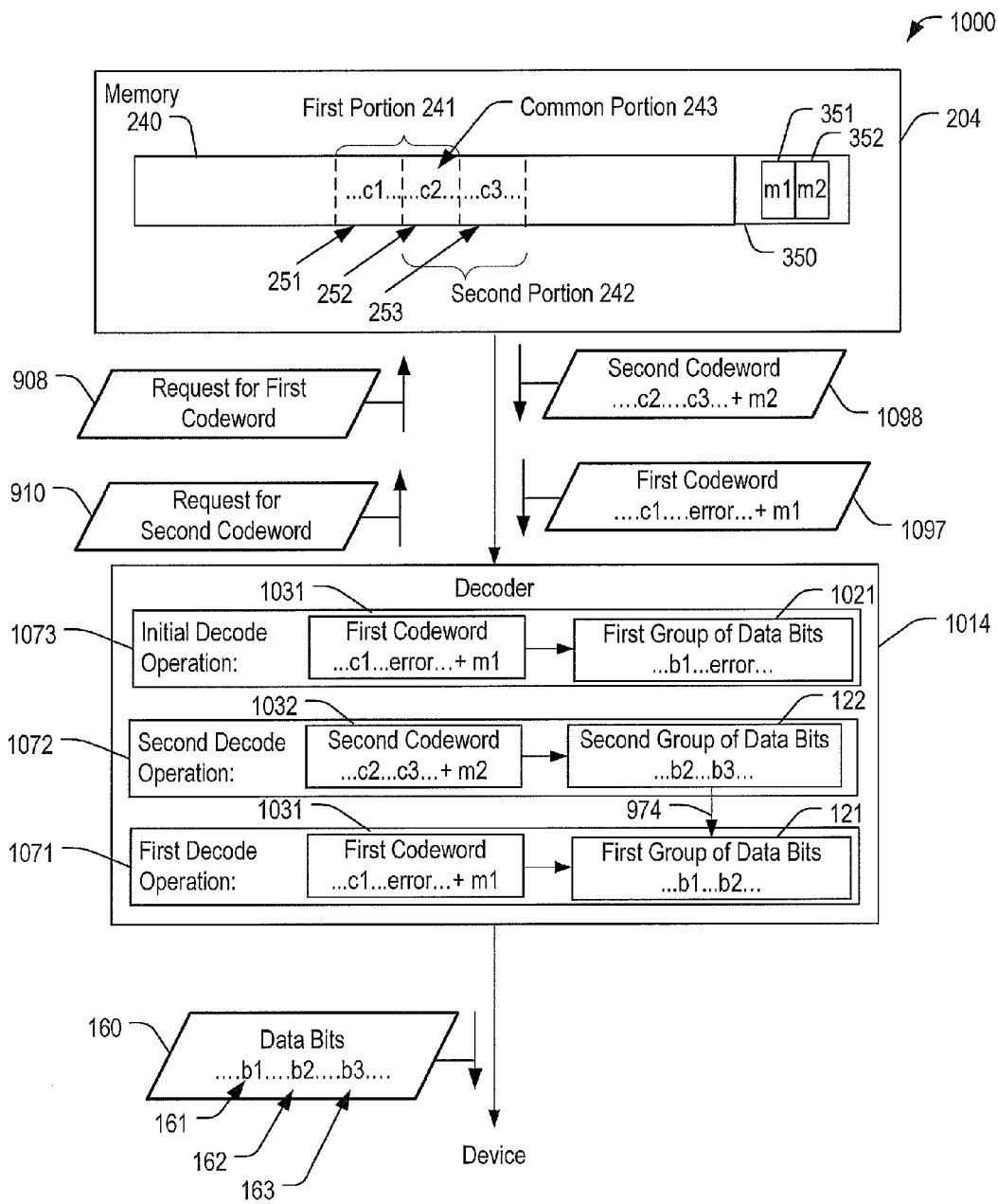
FIG. 10 is a block diagram of a seventh particular embodiment of a system to perform overlapping error correction operations.

FIG. 10 depicts an embodiment of a system 1000 including the memory 204 and a decoder 1014. The memory 204 includes the memory area 240 having the first portion 241, the second portion 242, and the common portion 243 aligned with the sectors 251-253. The memory 204 also includes the metadata portion 350 including the first metadata portion 351 and the second metadata portion 352.

The decoder 1014 is configured to initiate and execute multiple decode operations to decode codewords to their respective groups of data bits. For example, the decoder 1014 is configured to generate the request 908 for the first codeword, and in response receive first transmitted data 1097 including first data 1031. The first data 1031 corresponds to the first codeword 331 of FIG. 3 and includes one or more unrecoverable errors. The decoder 1014 may initiate an initial decode operation 1073 to decode the first data 1031 in an attempt to recover the first group 121 of data bits. The initial decode operation 1073 operates on the first data 1031 corresponding to the first codeword 331 and may generate a non-convergence error or an erroneous first group of data bits 1021 as a result of the unrecoverable error.

In response to a failure of the initial decode operation 1073, the decoder 1014 may send the second request 910 for the second codeword. In response, transmitted data 1098 corresponding to the second codeword 332 of FIG. 3 may be received from the memory 204. The data 1098 corresponding to the second codeword 332 may include the second codeword symbol c2, the third codeword symbol c3, and the second error correction bits m2. The decoder 1014 may receive the second transmitted data 1098 and initiate a second decode operation 1072 to recover the second group 122 of data bits from the second codeword 1032. The second group 122 of data bits includes decoded values for the second data bit b2 162 and the third data bit b3 163.

The decoder 1014, having determined the value of the second data bit b2 162 during the second decode operation 1072, may provide the value 974 of the second data bit b2 162 to be used in a first decode operation 1071 of the first data 1031 to generate the first group of data bits 121. The first decode operation 1071 may be performed using the received value 974 of the second data bit b2 162 and the first error correction bits m1 accompanying the first data 1031. As a result, the decoder 1014 uses error correction data and redundancy of data bits among the codewords to recover the data bits 160 and to provide the recovered data bits 160 to an external device.

Figure 11:
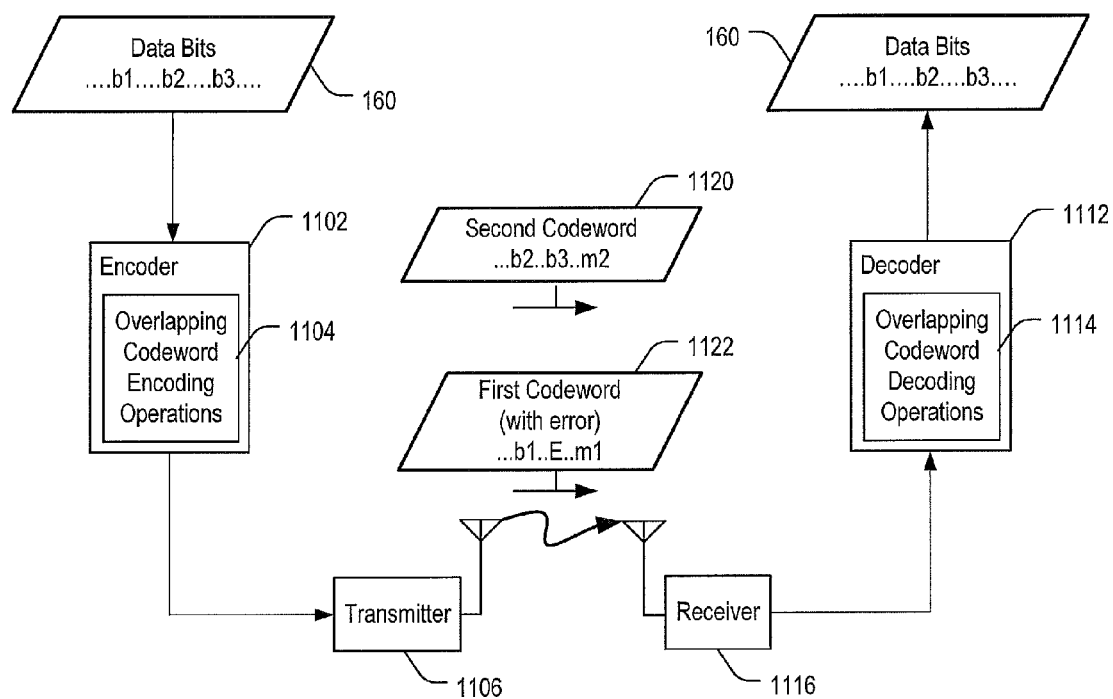
FIG. 11 is a block diagram of an eighth particular embodiment of a system to perform overlapping error correction operations.

FIG. 11 depicts an encoder 1102 coupled to a transmitter 1106 to transmit data to a receiver 1116 coupled to a decoder 1112. The encoder 1102 is configured to receive the data bits 160 and to perform overlapping codeword encoding operations 1104. The encoder 1102 may correspond to one or more of the encoder devices of FIGS. 1-4. For example, the overlapping codeword encoding operations 1104 may be the encode operations 171-172 of FIGS. 1-2, the encode operations 371-372 of FIG. 3, or the encode operations 471-473 of FIG. 4, as illustrative, non-limiting examples.

The transmitter 1106 is configured to receive overlapping codewords generated by the encoder 1102 and to transmit the overlapping codewords to the receiver 1116. For example, first transmission data 1122 corresponding to a first codeword and second transmission data 1120 corresponding to a second codeword 1120 may be transmitted via a wireless communication transmission, such as via a wireless wide area network (WWAN), an ad-hoc short range wireless communication network (e.g. a Bluetooth network), another wireless transmission, via a wireline transmission, or a combination thereof. The transmission medium may introduce noise to the transmission data, illustrated as an unrecoverable error ("E") in the first transmission data 1122.

The receiver 1116 is configured to receive transmission data such as the transmission data 1120, 1122 and provide the received data to the decoder 1112. The decoder 1112 is configured to perform overlapping codeword decoding operations 1114 to recover the data bits 160. For example, the decoder 1112 may correspond to one or more of the decoder devices of FIGS. 8-10, and the overlapping codeword decoding operations 1114 may be the decode operations 871-872 of FIG. 8, the decode operations 971-973 of FIG. 9, or the decode operations 1071-1073 of FIG. 10, as illustrative, non-limiting examples.

Although not illustrated in FIG. 11, the encoder 1102, the transmitter 1106, the receiver 1116, the decoder 1112, or any combination thereof, may include tangible memory such as one or more registers, one or more latches, a flash memory array, a random access memory (RAM) such as a static RAM (SRAM) or dynamic RAM (DRAM), or other tangible storage medium to at least temporarily store data corresponding to the overlapping codewords. For example, the transmitter 1106 may write codeword data to a buffer or cache to be further encoded and queued for wireless transmission via a wireless data network. Thus, one or more of the encoder 1102, the transmitter 1106, the receiver 1116, or the decoder 1112 may incorporate aspects of data storage and retrieval as described with respect to the memory area 240 of FIGS. 2-7 and 9-10.

Figure 12:
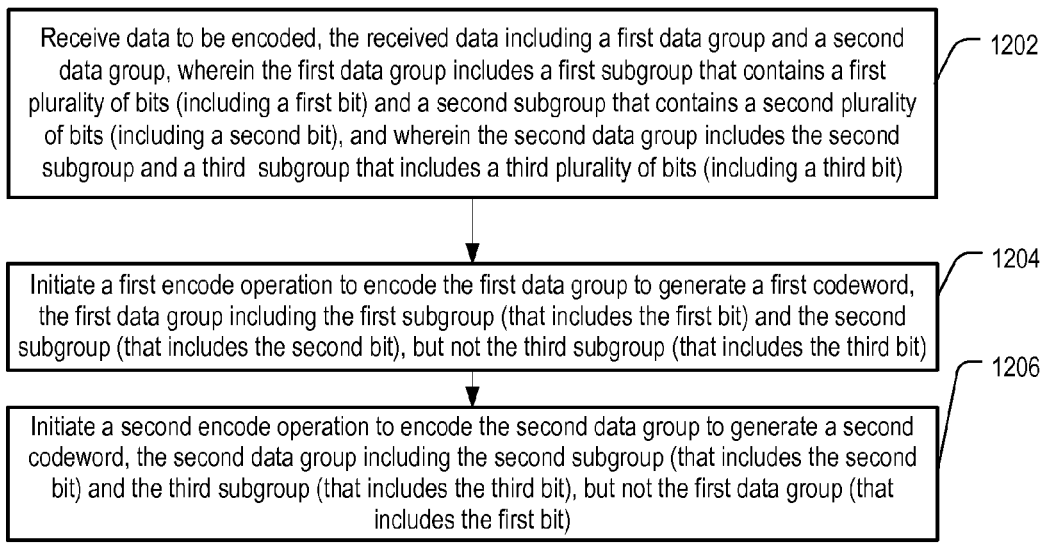
FIG. 12 is a flow diagram of a first particular embodiment of a method of performing overlapping error correction operations.

FIG. 12 depicts a first particular embodiment of a method of encoding data. The method includes, at an encoder device, receiving data bits to be encoded, the data bits including at least a first bit, a second bit, and a third bit, at 1202. For example, the encoder device may be the encoder device 114 of FIG. 1, the data storage device 200 of FIG. 2, the encoder 314 of FIG. 3, the data storage device 402 of FIG. 4, the encoder 1102 of FIG. 11, or any combination thereof, as illustrative, non-limiting examples.

A first encode operation to encode a first group of the data bits is initiated to generate a first codeword, the first group including the first bit and the second bit, but not the third bit, at 1204. A second encode operation to encode a second group of the data bits is initiated to generate a second codeword, the second group including the second bit and the third bit, but not the first bit, at 1206. For example, the first and second encode operations may be the encode operations 171-172 of FIGS. 1-2, the encode operations 371-372 of FIG. 3, or the encode operations 471-472 of FIG. 4, as illustrative, non-limiting examples.

The first codeword may enable detection of a first bit error at the first codeword and may enable recovery of the first group of data bits. The second codeword may enable detection of a second bit error at the second codeword and may enable recovery of the second group of data bits. To illustrate, the first codeword may be the codewords 131-132, the codewords 331-332, or the codewords 431-432 of the illustrated embodiments. For example, the first codeword may include first error correction bits and the second codeword may include second error correction bits, such as described with respect to the codewords 431-432 of FIG. 4.

The encoder device may be coupled to a memory and the method may include storing the first codeword and the second codeword to the memory. For example, the first and second codewords may be stored to the memory area 240 of the memory 204 as described with respect to the embodiments of FIGS. 2-7 and 9-10. Alternatively, or in addition, the method may include providing the first codeword and the second codeword to a transmitter that is configured to communicate with a receiver, such as the transmitter 1106 configured to communicate with the receiver 1116 of FIG. 11.

Figure 13:
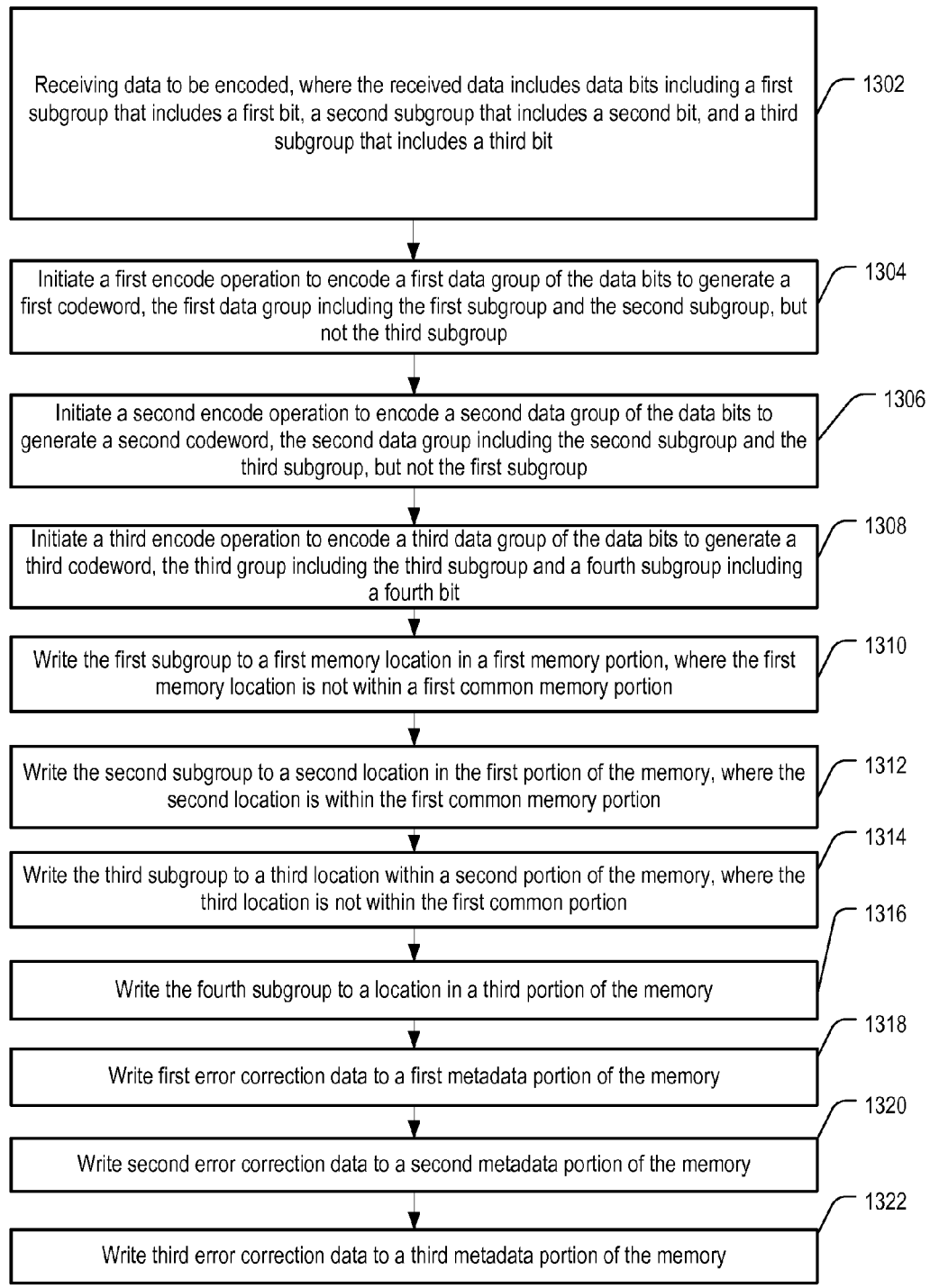
FIG. 13 is a flow diagram of a second particular embodiment of a method of performing overlapping error correction operations.

FIG. 13 depicts a second particular embodiment of a method of encoding data. The method includes, at an encoder device, receiving data bits to be encoded, the data bits including at least a first bit, a second bit, and a third bit, at 1302. A first encode operation to encode a first group of the data bits is initiated to generate a first codeword, at 1304. The first group includes the first bit and the second bit, but not the third bit. A second encode operation to encode a second group of the data bits is initiated to generate a second codeword, at 1306. The second group includes the second bit and the third bit, but not the first bit. For example, the first and second encode operations may be the encode operations 171-172 of FIGS. 1-2, the encode operations 371-372 of FIG. 3, or the encode operations 471-472 of FIG. 4, as illustrative, non-limiting examples.

The data bits may also include a fourth bit, where the first group does not include the fourth bit and where the second group does not include the fourth bit. A third encode operation may be initiated to encode a third group of the data bits to generate a third codeword, the third group including the third bit and the fourth bit but not the first bit and the second bit, at 1308. The data bits may include one or more additional bits, such as a fifth bit, where the first group includes the fifth bit, the second group includes the fifth bit, and the third group includes the fifth bit. For example, the data bits may be the data bits 460 of FIG. 4 and the first group, the second group, and the third group may be the groups 421, 422, and 423 of the data bits 460, respectively.

The encoder device may be coupled to a memory and the method may include storing the first codeword and the second codeword to the memory. For example, the memory may include a first portion and a second portion. The first portion and the second portion may overlap at a common portion, such as the first portion 241 and the second portion 242 that overlap at the common portion 243, as illustrated in FIGS. 2-4, or such as the first codeword 741 of FIG. 7 that overlaps with the second codeword 742 at the portions of the first user data area 781 that store the data values d2-d8.

Storing the first codeword and the second codeword to the memory may include writing the first bit to a first location within the first portion, wherein the first location is not within the common portion, at 1310. The second bit may be written to a second location within the common portion, at 1312. The third bit may be written to a third location within the second portion, where the third location is not within the common portion, at 1314. Using the system 400 of FIG. 4 as an example, the first bit b1 461 is written to a location within the first portion 241 that is not within the common portion 243, the second bit b2 462 is written to a location within the common portion 243, and the third bit b3 is written to a location within the second portion 242 that is not within the common portion 243.

The common portion may correspond to one or more sectors of the memory and may store data bits that are common to the first group of data bits and to the second group of data bits. For example, as illustrated in FIG. 7, the common portion between the first codeword 741 and the second codeword 742 may include seven sectors of the memory area 240 that store the data values d2-d8. The data values d2-d8 are common to the first codeword 741 and the second codeword 742.

In a first embodiment where the first codeword, the second codeword, and the third codeword are stored to the memory, at least part of the first codeword is stored at a first portion of the memory (e.g., the first bit is written to the first location within the first portion, at 1310), at least part of the second codeword is stored at a second portion of the memory (e.g., the third bit is written to the third location within the second portion, at 1314), and at least part of the third codeword, such as the fourth bit, is stored at a third portion of the memory, at 1316. The first portion and the second portion include a common portion, the second portion and the third portion include a second common portion, and the first portion, the second portion, and the third portion include a third common portion. As an example, the memory area 240 of FIG. 4 illustrates a common portion 243 common to the first portion 241 and the second portion 242, a second common portion 445 common to the second portion 242 and the third portion 444, and a third common portion 446 common to the portions 241, 242, and 444. FIG. 7 depicts another example, where the first portion stores codeword 741, the second portion stores codeword 742, and the third portion stores codeword 743. The first common portion stores d2, the second common portion stores d9, and the third common portion stores one or more of d3-d8.

In a second embodiment where the first codeword, the second codeword, and the third codeword are stored to the memory, the first portion and the second portion include a common portion, the second portion and the third portion include a second common portion, and there is no overlap between the first codeword and the third codeword. As an example, FIG. 5 depicts no overlap between the first portion 241 and the third portion 444 and also no overlap between the error correction bits m1 and m3.

The memory may include a first metadata portion and a second metadata portion, where the first metadata portion does not overlap the second metadata portion. For example, the first metadata portion and the second metadata portion may be the metadata portions 351-352 of FIG. 4. Storing the first codeword and the second codeword to the memory may also include writing first error correction bits corresponding to the first codeword to the first metadata portion of the memory, at 1318. Second error correction bits corresponding to the second codeword may also be written to the second metadata portion of the memory, at 1320. Storing the third codeword may include writing third error correction bits corresponding to the third codeword to a third metadata portion of the memory, at 1322.

Figure 14:
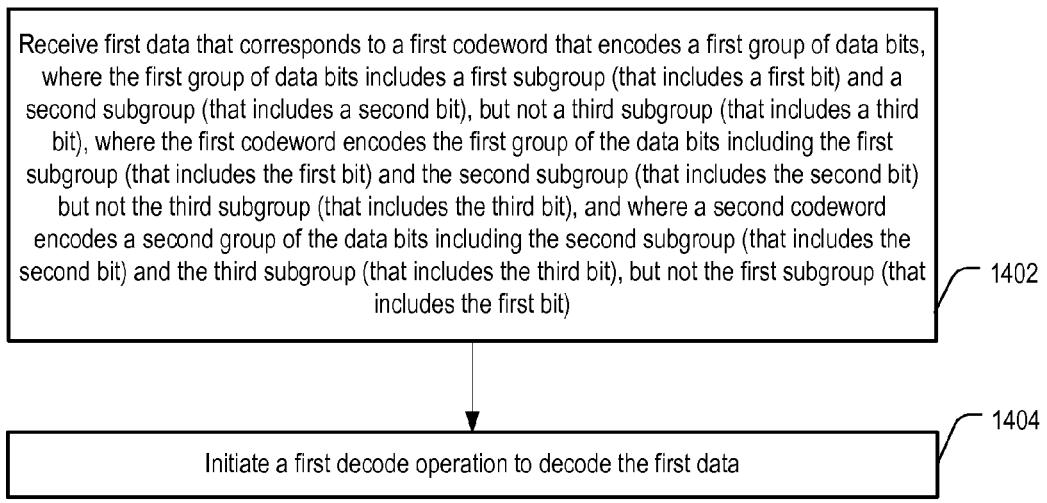
FIG. 14 is a flow diagram of a third particular embodiment of a method of performing overlapping error correction operations.

FIG. 14 depicts a first particular embodiment of a method of decoding data. The method may be performed at a decoder device that is coupled to receive data corresponding to data bits that have been encoded, the data bits including a first bit, a second bit, and a third bit. As illustrative, non-limiting examples, the decoder device may be the decoder 814 of FIG. 8, the decoder 914 of FIG. 9, the decoder 1014 of FIG. 10, or the decoder 1112 of FIG. 11.

A first codeword encodes a first group of the data bits. The first group of the data bits includes the first bit and the second bit but not the third bit. For example, the first codeword may be the first codeword 131 of FIG. 8 that encodes the first group 121 of the data bits 160.

A second codeword encodes a second group of the data bits. The second group of the data bits includes the second bit and the third bit, but not the first bit. For example, the second codeword may be the second codeword 132 of FIG. 8 that encodes the second group 122 of the data bits 160.

First data that corresponds to the first codeword is received, at 1402. For example, the first data may be the data received at the decoder device 814 of FIG. 8 that corresponds to the first codeword 131 that encodes the first group 121 of the data bits 160. A first decode operation is initiated to decode the first data, at 1404. For example, the first decode operation may correspond to the decode operation 871 of FIG. 8.

The decoder device may receive the data corresponding to the encoded data bits from a memory that has a first portion storing the first data and a second portion storing the second data. The first portion of the memory and the second portion of the memory may include a common portion that stores part of the first data corresponding to the second bit and part of the second data corresponding to the second bit.

In a first embodiment, the memory enables "random" access, i.e. read access to data beginning at a requested read location. For example, the first data may be received in response to a request for read access to the first portion. The first data does not include data stored at the memory other than at the first portion. For example, the request for read access to the first portion may be the request 908 of FIG. 9 and may include a request to access data stored at the first sector 251 and the second sector 252, but not the third sector 253. The second data is received in response to a request for read access to the second portion. The second data does not include data stored at the memory other than at the second portion. For example, the request for read access to the second portion may be the request 910 of FIG. 9 and may include a request to access data stored at the second sector 252 and the third sector 253, but not the first sector 251. The first data and the second data need not be sequentially retrieved from the memory and instead are retrieved in response to the respective requests for read access.

In a second embodiment, the memory enables read access by retrieving data stored in multiple contiguous portions of the memory, such as an entire wordline of the memory storing data corresponding to multiple codewords. The data corresponding to the encoded data bits is received in response to a single request for read access to the memory. The received data includes the first data, the second data, and third data corresponding to a third codeword, where the third codeword encodes a third group of the data bits that includes all data bits of the second group not included in the first group. For example, data read from the memory area 240 including the data areas 781 and 782 of FIG. 7 may be received in response to a single request. The received data may include data corresponding to the first codeword 741, the codewords 742-748 that overlap the first codeword 741, and the ninth codeword 749 that is adjacent to the first codeword 741 and that does not overlap the first codeword 741. The received data is decoded by initiating the first decode operation to decode the first data and initiating a third decode operation to decode the third data without initiating a second decode operation to decode the second data. To illustrate, decoding of the overlapping codewords 742-748 need not be performed when the first codeword 741 and the ninth codeword 749 are successfully decoded. Thus, all data in the user data area 740 may be retrieved by initiating decode operations to decode adjacent codewords (e.g. codewords 741 and 749) without initiating decode operations to decode any of the overlapping codewords (e.g. codewords 742-748).

Figure 15:
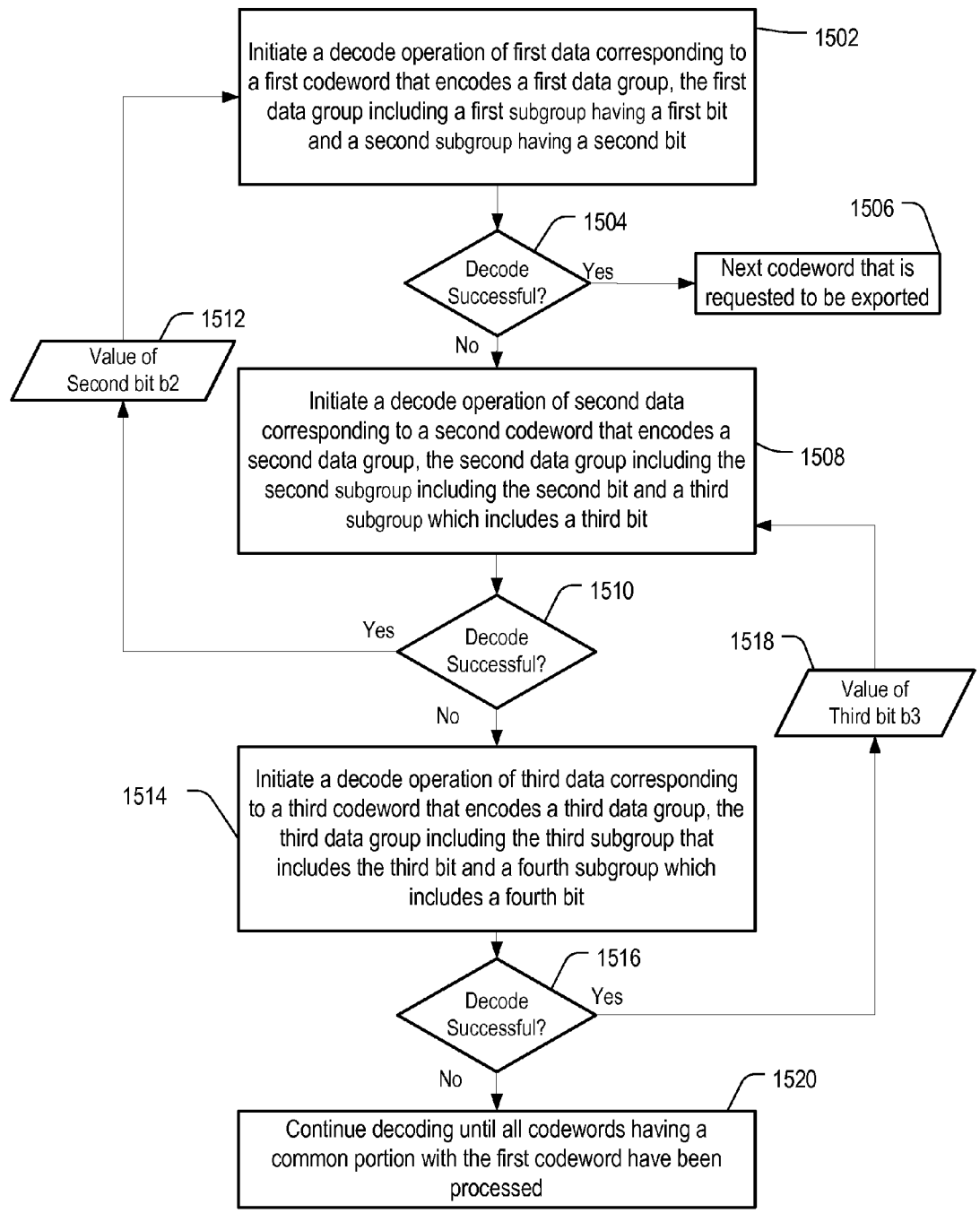
FIG. 15 is a flow diagram of a fourth particular embodiment of a method of performing overlapping error correction operations.

FIG. 15 depicts a second particular embodiment of a method of decoding data. The method may be performed by the decoder 814 of FIG. 8, the decoder 914 of FIG. 9, the decoder 1014 of FIG. 10, or the decoder 1112 of FIG. 11, as illustrative, non-limiting examples.

A decode operation of a first codeword that encodes first data is initiated, at 1502. The first data includes a first bit and a second bit. For example, the decoder 1014 of FIG. 10 may initiate the initial decode operation 1073 to decode the first data 1031 to recover the first group 121 of the data bits 160 including the first bit b1 161 and the second bit b2 162.

A determination is made whether the decode operation was successful, at 1504. When the decode operation is determined to be successful, decode processing continues with a next codeword that is requested to be exported, at 1506. In response to determining that the decode operation is unsuccessful, at 1504, a decode operation of a second codeword that encodes second data is initiated, at 1508. The second data includes the second bit and a third bit. For example, upon determining that the initial decode operation 1073 of FIG. 10 is unsuccessful, the decoder 1014 may send the request 910 for the second codeword from the memory 204 and initiate the second decode operation 1072 on the second data 1032 corresponding to the second codeword 132.

A determination is made whether the decode operation of the second codeword was successful, at 1510. When the decode operation of the second codeword is determined to be successful, processing returns to 1502 where a decode operation of the first codeword that encodes first data is initiated and is provided with a value of the second bit, at 1512. For example, the decoder 1014 of FIG. 10 may initiate the first decode operation 1071 and provide the value 974 of the second bit b2 162 to the first decode operation 1071.

In response to determining that the decode operation of the second codeword is unsuccessful, at 1510, a decode operation of a third codeword that encodes third data may be initiated, at 1514. The third data includes the third bit and a fourth bit. For example, the third data may overlap the first data and the second data, such as the third group 423 of FIG. 4. Alternatively, the third data may overlap the second data but may not overlap the first data, such as illustrated in FIG. 5.

A determination is made whether the decode operation of the third codeword was successful, at 1516. When the decode operation of the third codeword is determined to be successful, processing returns to 1508 where a decode operation of the second codeword is initiated and is provided with a value of the third bit, at 1518. Alternatively, or in addition, if the third data overlaps the first data, such as the fifth bit b5 465 of FIG. 4, the decode operation of the first codeword that encodes first data may be initiated, at 1502, and provided with the value of the fifth bit b5 465.

In response to determining that the decode operation of the third codeword is unsuccessful, at 1516, decoding may continue by continuing to initiate decode operations of other codewords until all codewords that at least partially overlap the first codeword have been processed, at 1520. Using the embodiment of FIG. 7 as an example, if errors occurring in d1 and d8 collectively cause the codeword 741 to be unrecoverable, the second codeword 742 may be decoded to attempt to recover d8 independent of d1. If the second codeword 742 is also unrecoverable, decoding of the third codeword 743 may be attempted. Decode processing may continue until all codewords that include d8, i.e. the codewords 741-748, have been processed. Recovered data from any or all of the decode operations may be used during parallel or subsequent decode operations. For example, recovered data that may be exchanged between concurrent or sequential decode operations may include recovered bit values, confidence or reliability data relating to bit values, or any combination thereof.

Although FIG. 15 illustrates that decoding continues at 1520 until all codewords having a common portion with the first portion have been processed, in another embodiment decoding may instead continue until all codewords having direct or indirect connection with the first codeword have been processed. For example, codeword A and codeword B have a "direct connection" when codeword A and codeword B overlap. Codeword A and codeword C have an "indirect connection" when codeword A does not overlap codeword C but instead overlaps codeword B, which overlaps codeword C. To illustrate, codewords 741 and 742 of FIG. 7 have a direct connection, while codewords 741 and 749 do not have a direct connection but have an indirect connection.

Although various components depicted herein are illustrated as block components and described in general terms, such components may include one or more microprocessors, state machines, or other circuits configured to enable the encoder device 114 of FIG. 1, the decoder device 814 of FIG. 8, the data storage device of FIG. 2 or 4, or the system of FIG. 3 or FIGS. 9-11 to perform the particular functions attributed to such components, or any combination thereof. For example, the controller 212 of FIG. 2 may represent physical components, such as hardware controllers, state machines, logic circuits, or other structures to enable the data storage device 202 of FIG. 2 to perform data encoding, storage, retrieval, and decoding using overlapping codewords.

For example, the encoder 214 may be implemented using dedicated circuitry configured to perform encoding on the groups 121-122 according to a RS or BCH encoding algorithm for speed of operation. Alternatively, or in addition, portions of the encoder 212 may be implemented using a microprocessor or microcontroller programmed to perform encoding on the groups 121-122. In a particular embodiment, the encoder 212 includes executable instructions that are executed by a processor and the instructions are stored at the memory 204, such as a flash memory array. Alternatively, or in addition, executable instructions that are executed by a processor that may be included in the controller 212 may be stored at a separate memory location that is not part of the memory array 204, such as at a read-only memory (ROM) (not shown).

In a particular embodiment, the data storage device of FIG. 2 or FIG. 4 may be a portable device configured to be selectively coupled to one or more external devices, such as a host device. However, in other embodiments, the data storage device may be attached or embedded within one or more host devices, such as within a housing of a portable communication device. For example, the data storage device 302 may be within a packaged apparatus such as a wireless telephone, a personal digital assistant (PDA), a gaming device or console, a portable navigation device, or other device that uses internal non-volatile memory. The data storage device 302 may include a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of encoding data, the method comprising:
    at an encoder device coupled to a memory, the memory including a first portion and a second portion, wherein the first portion and the second portion overlap at a first common portion:
        receiving data to be encoded, the data including a first data group and a second data group, wherein the first data group includes a first subgroup that contains a first plurality of bits and a second subgroup that contains a second plurality of bits, and wherein the second data group includes the second subgroup and a third subgroup that includes a third plurality of bits;
        initiating a first encode operation to encode the first data group to generate a first codeword;
        initiating a second encode operation to encode the second data group to generate a second codeword; and
        storing the first codeword and the second codeword to the memory, wherein storing the first codeword and the second codeword to the memory comprises:
            writing the first subgroup and the second subgroup to the first portion of the memory, wherein the first subgroup is not within the first common portion and the second subgroup is within the first common portion; and
            writing the third subgroup to the second portion, wherein the third subgroup is not within the first portion and not within the first common portion.

2. The method of claim 1, wherein the first codeword enables detection of a first bit error at the first codeword and recovery of the first data group and wherein the second codeword enables detection of a second bit error at the second codeword and recovery of the second data group.

3. The method of claim 1, wherein the first codeword includes first error correction bits and wherein the second codeword includes second error correction bits.

4. The method of claim 1, wherein storing the first codeword and the second codeword to the memory includes storing the first data group to the first portion of the memory and storing the second data group to the second portion of the memory, wherein the common portion corresponds to one or more sectors of the memory and stores bits that are common to the first data group and to the second data group.

5. The method of claim 1, wherein the memory further includes a first metadata portion and a second metadata portion, wherein the first metadata portion does not overlap the second metadata portion, and wherein storing the first codeword and the second codeword to the memory further comprises:
    writing first error correction bits corresponding to the first codeword to the first metadata portion of the memory; and
    writing second error correction bits corresponding to the second codeword to the second metadata portion of the memory.

6. The method of claim 1, wherein the received data includes a third data group, the third data group including the third subgroup and a fourth subgroup, the fourth subgroup containing a fourth plurality of bits, wherein the first data group does not include the fourth subgroup and wherein the second data group does not include the fourth subgroup, the method further comprising initiating a third encode operation to encode the third data group to generate a third codeword.

7. The method of claim 6, wherein the first data group also includes the third subgroup, wherein the third subgroup includes a data bit, the second group includes the data bit, and the third group includes the data bit.

8. The method of claim 7, further comprising storing the third codeword to the memory,
    wherein at least part of the first codeword is stored at the first portion of the memory, wherein at least part of the second codeword is stored at the second portion of the memory, wherein at least part of the third codeword is stored at a third portion of the memory, and
    wherein the first portion, the second portion and the third portion include a second common portion.

9. The method of claim 6, further comprising storing the third codeword to the memory,
wherein at least part of the first codeword is stored at the first portion of the memory, wherein at least part of the second codeword is stored at the second portion of the memory, and wherein at least part of the third codeword is stored at a third portion of the memory, and
wherein the second portion and the third portion include a second common portion, and wherein there is no overlap between the first codeword and the third codeword.

10. The method of claim 1, further comprising providing the first codeword and the second codeword to a transmitter that is configured to communicate with a receiver.

11. A method comprising:
at a decoder device that is coupled to receive data corresponding to previously encoded data wherein a first codeword encodes a first data group, wherein the first data group includes a first subgroup that contains a first plurality of bits and a second subgroup that contains a second plurality of bits, and wherein a second codeword encodes a second data group, wherein the second data group includes the second subgroup and a third subgroup but not the first subgroup, wherein the third subgroup contains a third plurality of bits, and wherein the first data group does not include the third subgroup:
receiving first data that corresponds to the first codeword and second data that corresponds to the second codeword;
initiating a second decode operation to decode the second data, wherein the second decode operation is initiated in response to a prior decode operation failing to decode the first data due to errors in the first data; and
initiating a third decode operation to decode the first data after decoding the second data.

12. The method of claim 11, wherein the decoder device receives the first data and the second data from a memory that has a first portion storing the first data and a second portion storing second data.

13. The method of claim 12, wherein the first portion of the memory and the second portion of the memory include a common portion that stores part of the first data and part of the second data.

14. The method of claim 13, wherein the first data is received in response to a request for read access to the first portion and wherein the first data does not include data stored at the memory other than at the first portion.

15. The method of claim 14, wherein the second data is received in response to a request for read access to the second portion and wherein the second data does not include data stored at the memory other than at the second portion.

16. The method of claim 13, wherein the data corresponding to the previously encoded data is received in response to a single request for read access to the memory, the received data including the first data, the second data, and third data corresponding to a third codeword, wherein the third codeword encodes a third data group that includes all data of the second group not included in the first group, and wherein the received data is decoded by initiating a first decode operation to decode the first data and initiating a fourth decode operation to decode the third data without initiating the second decode operation to decode the second data.

17. The method of claim 12, wherein the memory further includes a third portion storing third data, wherein the third data corresponds to a third codeword that encodes a third data group, wherein the third data group includes the third subgroup and a fourth subgroup, the fourth subgroup including a fourth plurality of bits, and further comprising:
in response to the second decode operation failing to decode the second data:
initiating a fourth decode operation to decode the third data to generate values of the third subgroup and the fourth subgroup; and
initiating another decode operation to decode the second data using the values of the third subgroup.

18. The method of claim 12, wherein the first data and the second data are received via a receiver.

19. The method of claim 11, wherein the second data is received prior to receiving the first data.

20. The method of claim 19, wherein the second decode operation is completed before the third decode operation is completed and wherein the third decode operation uses a value of the second decode operation.

21. The method of claim 19, further comprising:
receiving first error correction bits; and
receiving second error correction bits;
wherein the third decode operation to decode the first data uses the first error correction bits, but not the second error correction bits, and
wherein the second decode operation to decode the second data uses the second error correction bits but not the first error correction bits.

22. A device comprising:
an encoder configured to receive data from a data source, the data including a first data group and a second data group, wherein the first data group includes a first subgroup that contains a first plurality of bits and a second subgroup that contains a second plurality of bits, and wherein the second data group includes the second subgroup and a third subgroup that includes a third plurality of bits and to:
initiate a first encode operation at the encoder to encode the first data group to generate a first codeword; and
initiate a second encode operation at the encoder to encode the second data group to generate a second codeword;
a memory having a first portion and a second portion, wherein the first portion and the second portion include a common portion; and
a controller coupled to the memory and to the encoder, wherein the controller is configured to:
send the first subgroup to a first location within the first portion, wherein the first location is not within the common portion;
send the second subgroup to a second location within the common portion; and
send the third subgroup to a third location within the second portion, wherein the third location is not within the common portion.

23. The device of claim 22, wherein the first codeword includes the first data group and first error correction bits and wherein the second codeword includes the second data group and second error correction bits.

24. The device of claim 23, wherein the memory further includes a first metadata portion and a second metadata portion, wherein the first metadata portion does not overlap the second metadata portion, and wherein the controller is further configured to:
send the first error correction bits to be stored at the first metadata portion of the memory; and
send the second error correction bits to be stored at the second metadata portion of the memory.

25. The device of claim 22, wherein the encoder is within a transmitter of a communication system.

26. A device comprising:
a decoder coupled to receive data corresponding to previously encoded data, the previously encoded data including a first data group and a second data group, wherein the first data group includes a first subgroup that contains a first plurality of bits and a second subgroup that contains a second plurality of bits and wherein the first data group has been encoded to form a first codeword, and wherein the second data group includes the second subgroup and a third subgroup that includes a third plurality of bits and wherein the second data group has been encoded to form a second codeword, wherein the first data group does not include the third subgroup and the second data group does not contain the first subgroup, wherein the decoder is configured to:
receive first data that corresponds to the first codeword and second data that corresponds to the second codeword;
initiate a second decode operation to decode the second data, wherein the second decode operation is initiated in response to a prior decode operation failing to decode the first data due to errors in the first data; and
initiate a third decode operation to decode the first data after decoding the second data.

27. The device of claim 26, further comprising:
a memory having a first portion and a second portion, wherein the first portion and the second portion include a common portion; and
a controller coupled to the memory and to the decoder, wherein the controller is configured to:
retrieve the first data from the first portion of the memory; and
retrieve second data that corresponds to the second codeword from the second portion of the memory.

28. The device of claim 27, wherein the first data is retrieved in response to a request for read access to the first portion and wherein the first data does not include data stored at the memory other than at the first portion.

29. The device of claim 28, wherein the second data is retrieved in response to a request for read access to the second portion and wherein the second data does not include data stored at the memory other than at the second portion.

30. The device of claim 27, wherein the data corresponding to the encoded data is retrieved in response to a single request for read access to the memory, the retrieved data including the first data, the second data, and third data corresponding to a third codeword, wherein the third codeword encodes data of the second group not included in the first group, and wherein the received data is decoded by initiating a fourth decode operation to decode the first data and initiating a fifth decode operation to decode the third data without initiating a second decode operation to decode the second data.

31. The device of claim 27, wherein the controller is further configured to:
generate values associated with the second data in response to the prior decode operation failing to decode the first data due to errors in the first data; and
initiate the first decode operation at the decoder to decode the first data using values from the second data group.

* * * * *